(12) United States Patent
Kirby et al.

(10) Patent No.: US 7,262,134 B2
(45) Date of Patent: Aug. 28, 2007

(54) MICROFEATURE WORKPIECES AND METHODS FOR FORMING INTERCONNECTS IN MICROFEATURE WORKPIECES

(75) Inventors: Kyle K. Kirby, Boise, ID (US); William M. Hiatt, Eagle, ID (US); Richard L. Stocks, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,243

(22) Filed: Sep. 1, 2005

(65) Prior Publication Data

US 2007/0045858 A1    Mar. 1, 2007

(51) Int. Cl.
*H01L 21/44* (2006.01)

(52) U.S. Cl. ............. 438/672; 438/675; 257/E21.49; 257/E21.305; 257/E21.575

(58) Field of Classification Search ............ 438/672, 438/675; 257/E21.49, E21.305, E21.575
See application file for complete search history.

(56) References Cited

U.S. PATENT DOCUMENTS

| | | | |
|---|---|---|---|
| 3,345,134 A | 10/1967 | Heymer et al. | |
| 4,040,168 A * | 8/1977 | Huang | 438/576 |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,435,887 A | 7/1995 | Rothschild et al. | |
| 5,438,212 A * | 8/1995 | Okaniwa | 257/275 |
| 5,505,804 A | 4/1996 | Mizuguchi et al. | |
| 5,593,913 A | 1/1997 | Aoki | |
| 5,605,783 A | 2/1997 | Revelli et al. | |
| 5,672,519 A | 9/1997 | Song et al. | |
| 5,690,841 A * | 11/1997 | Elderstig | 216/39 |
| 5,694,246 A | 12/1997 | Aoyama et al. | |
| 5,708,293 A | 1/1998 | Ochi et al. | |
| 5,771,158 A | 6/1998 | Yamagishi et al. | |

(Continued)

FOREIGN PATENT DOCUMENTS

FR    2 835 654 A1    8/2003

(Continued)

OTHER PUBLICATIONS

U.S. Appl. No. 10/785,466, Kirby.

(Continued)

*Primary Examiner*—Michelle Estrada
*Assistant Examiner*—Jarrett J. Stark
(74) *Attorney, Agent, or Firm*—Perkins Coie LLP

(57) ABSTRACT

Methods for forming interconnects in microfeature workpieces, and microfeature workpieces having such interconnects are disclosed herein. In one embodiment, a method of forming an interconnect in a microfeature workpiece includes forming a hole extending through a terminal and a dielectric layer to at least an intermediate depth in a substrate of a workpiece. The hole has a first lateral dimension in the dielectric layer and a second lateral dimension in the substrate proximate to an interface between the dielectric layer and the substrate. The second lateral dimension is greater than the first lateral dimension. The method further includes constructing an electrically conductive interconnect in at least a portion of the hole and in electrical contact with the terminal.

32 Claims, 25 Drawing Sheets

U.S. PATENT DOCUMENTS

| | | | |
|---|---|---|---|
| 5,776,824 | A | 7/1998 | Farnworth et al. |
| 5,811,799 | A | 9/1998 | Wu |
| 5,821,532 | A | 10/1998 | Beaman et al. |
| 5,847,454 | A * | 12/1998 | Shaw et al. ................ 257/734 |
| 5,857,963 | A | 1/1999 | Pelchy et al. |
| 5,861,654 | A | 1/1999 | Johnson |
| 5,877,040 | A | 3/1999 | Park et al. |
| 5,897,338 | A | 4/1999 | Kaldenberg |
| 5,914,488 | A | 6/1999 | Sone |
| 5,977,535 | A | 11/1999 | Rostoker |
| 5,998,862 | A | 12/1999 | Yamanaka |
| 6,080,291 | A | 6/2000 | Woodruff et al. |
| 6,104,086 | A | 8/2000 | Ichikawa et al. |
| 6,114,240 | A | 9/2000 | Akram et al. |
| 6,143,588 | A | 11/2000 | Glenn |
| 6,180,518 | B1 * | 1/2001 | Layadi et al. ............... 438/639 |
| 6,236,046 | B1 | 5/2001 | Watabe et al. |
| 6,259,083 | B1 | 7/2001 | Kimura |
| 6,266,197 | B1 | 7/2001 | Glenn et al. |
| 6,274,927 | B1 | 8/2001 | Glenn |
| 6,285,064 | B1 | 9/2001 | Foster |
| 6,351,027 | B1 | 2/2002 | Giboney et al. |
| 6,372,548 | B2 | 4/2002 | Bessho et al. |
| 6,406,636 | B1 * | 6/2002 | Vaganov ....................... 216/2 |
| 6,407,381 | B1 | 6/2002 | Glenn et al. |
| 6,411,439 | B2 | 6/2002 | Nishikawa |
| 6,483,652 | B2 | 11/2002 | Nakamura |
| 6,503,780 | B1 | 1/2003 | Glenn et al. |
| 6,541,762 | B2 | 4/2003 | Knag et al. |
| 6,560,047 | B2 | 5/2003 | Choi et al. |
| 6,566,745 | B1 | 5/2003 | Beyne et al. |
| 6,603,183 | B1 | 8/2003 | Hoffman |
| 6,617,623 | B2 | 9/2003 | Rhodes |
| 6,661,047 | B2 | 12/2003 | Rhodes |
| 6,667,551 | B2 | 12/2003 | Hanaoka et al. |
| 6,670,986 | B1 | 12/2003 | Ben Shoshan et al. |
| 6,686,588 | B1 | 2/2004 | Webster et al. |
| 6,703,310 | B2 | 3/2004 | Mashino et al. |
| 6,708,405 | B2 * | 3/2004 | Hasler et al. ................ 29/852 |
| 6,734,419 | B1 | 5/2004 | Glenn et al. |
| 6,759,266 | B1 | 7/2004 | Hoffman |
| 6,774,486 | B2 | 8/2004 | Kinsman |
| 6,778,046 | B2 | 8/2004 | Stafford et al. |
| 6,791,076 | B2 | 9/2004 | Webster |
| 6,795,120 | B2 | 9/2004 | Takagi et al. |
| 6,797,616 | B2 | 9/2004 | Kinsman |
| 6,800,943 | B2 | 10/2004 | Adachi |
| 6,813,154 | B2 | 11/2004 | Diaz et al. |
| 6,825,127 | B2 * | 11/2004 | Ouellet et al. .............. 438/745 |
| 6,825,458 | B1 | 11/2004 | Moess et al. |
| 6,828,663 | B2 | 12/2004 | Chen et al. |
| 6,828,674 | B2 | 12/2004 | Karpman |
| 6,844,978 | B2 | 1/2005 | Harden et al. |
| 6,852,621 | B2 * | 2/2005 | Hanaoka et al. ............ 438/638 |
| 6,864,172 | B2 | 3/2005 | Noma et al. |
| 6,882,021 | B2 | 4/2005 | Boon et al. |
| 6,885,107 | B2 | 4/2005 | Kinsman |
| 6,934,065 | B2 | 8/2005 | Kinsman |
| 6,946,325 | B2 | 9/2005 | Yean et al. |
| 2002/0006687 | A1 | 1/2002 | Lam |
| 2002/0027293 | A1 * | 3/2002 | Hoshino ..................... 257/774 |
| 2002/0057468 | A1 | 5/2002 | Segawa et al. |
| 2002/0089025 | A1 | 7/2002 | Chou |
| 2002/0096729 | A1 | 7/2002 | Tu et al. |
| 2002/0113296 | A1 | 8/2002 | Cho et al. |
| 2002/0145676 | A1 | 10/2002 | Kuno et al. |
| 2003/0062601 | A1 | 4/2003 | Harnden et al. |
| 2004/0012698 | A1 | 1/2004 | Suda et al. |
| 2004/0023469 | A1 | 2/2004 | Suda |
| 2004/0038442 | A1 | 2/2004 | Kinsman |
| 2004/0041261 | A1 | 3/2004 | Kinsman |
| 2004/0046251 | A1 * | 3/2004 | Lee ............................ 257/734 |
| 2004/0082094 | A1 | 4/2004 | Yamamoto |
| 2004/0198040 | A1 * | 10/2004 | Geefay et al. .............. 438/667 |
| 2004/0214373 | A1 | 10/2004 | Jiang et al. |
| 2004/0219342 | A1 * | 11/2004 | Boggs et al. ............... 428/209 |
| 2004/0245649 | A1 | 12/2004 | Imaoka |
| 2005/0052751 | A1 | 3/2005 | Liu et al. |
| 2005/0104228 | A1 | 5/2005 | Rigg et al. |
| 2005/0110889 | A1 | 5/2005 | Tuttle et al. |
| 2005/0127478 | A1 | 6/2005 | Hiatt et al. |
| 2005/0151228 | A1 | 7/2005 | Tanida et al. |
| 2005/0208766 | A1 * | 9/2005 | Kirby et al. ................ 438/667 |
| 2005/0236708 | A1 | 10/2005 | Farnworth et al. |
| 2005/0254133 | A1 | 11/2005 | Akram et al. |
| 2006/0046438 | A1 * | 3/2006 | Kirby ......................... 438/464 |
| 2006/0046468 | A1 * | 3/2006 | Akram et al. ............... 438/637 |
| 2006/0292877 | A1 * | 12/2006 | Lake .......................... 438/694 |

FOREIGN PATENT DOCUMENTS

| | | |
|---|---|---|
| JP | 59-101882 A | 6/1984 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,839, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlitography 2002, Mar. 3-8, 2002, Santa Clara, CA.

Cheng, Yu-T. et al., "Vacuum Packaging Technolgy Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kycera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id =10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

MICROFEATURE WORKPIECES AND METHODS FOR FORMING INTERCONNECTS IN MICROFEATURE WORKPIECES

TECHNICAL FIELD

The present invention relates to methods for forming interconnects in microfeature workpieces and microfeature workpieces formed using such methods.

BACKGROUND

Microelectronic devices, micromechanical devices, and other devices with microfeatures are typically formed by constructing several layers of components on a workpiece. In the case of microelectronic devices, a plurality of dies are fabricated on a single workpiece, and each die generally includes an integrated circuit and a plurality of bond-pads coupled to the integrated circuit. The dies are separated from each other and packaged to form individual microelectronic devices that can be attached to modules or installed in other products.

One aspect of fabricating and packaging such dies is forming interconnects that electrically couple conductive components located in different layers. In some applications, it may be desirable to form interconnects that extend completely through the dies or through a significant portion of the dies. Such interconnects electrically couple bond-pads or other conductive elements proximate to one side of the dies to conductive elements proximate to the other side of the dies. Through-wafer interconnects, for example, are constructed by forming deep vias on the front side and/or backside of the workpiece and in alignment with corresponding bond-pads at the front side of the workpiece. The vias are often blind vias in that they are closed at one end. The blind vias are then filled with a conductive fill material. After further processing, the workpiece is thinned to reduce the thickness of the final dies. Solder balls or other external electrical contacts are subsequently attached to the through-wafer interconnects at the backside and/or the front side of the workpiece. The solder balls or external contacts can be attached either before or after singulating the dies from the workpiece.

One concern of forming through-wafer interconnects is that conventional processes are susceptible to shorting. For example, FIGS. 1A-1C illustrate a conventional process of forming a through-wafer interconnect. FIG. 1A is a schematic side cross-sectional view of a workpiece 100 including a substrate 112, a terminal 122 on the substrate 112, and a hole 145 extending through the terminal 122 and into the substrate 112. After forming the hole 145, a dielectric layer 134 is deposited across the workpiece 100 and into the hole 145 to insulate the substrate 112 from the conductive material of the interconnect. FIG. 1B illustrates the workpiece 100 after removing a portion of the dielectric layer 134 with a spacer etching process. This process sometimes exposes a section 115 of an upper surface 114 on the substrate 112. FIG. 1C illustrates the workpiece 100 after forming a conductive interconnect 182 in the hole 145 with the interconnect 182 contacting the terminal 122. If the substrate 112 includes an exposed section 115, the interconnect 182 may also contact the substrate 112 and create a short between the terminal 122 and the substrate 112. Therefore, there is a need to improve the process of forming interconnects in workpieces.

DETAILED DESCRIPTION

A. Overview

Figure 1A:
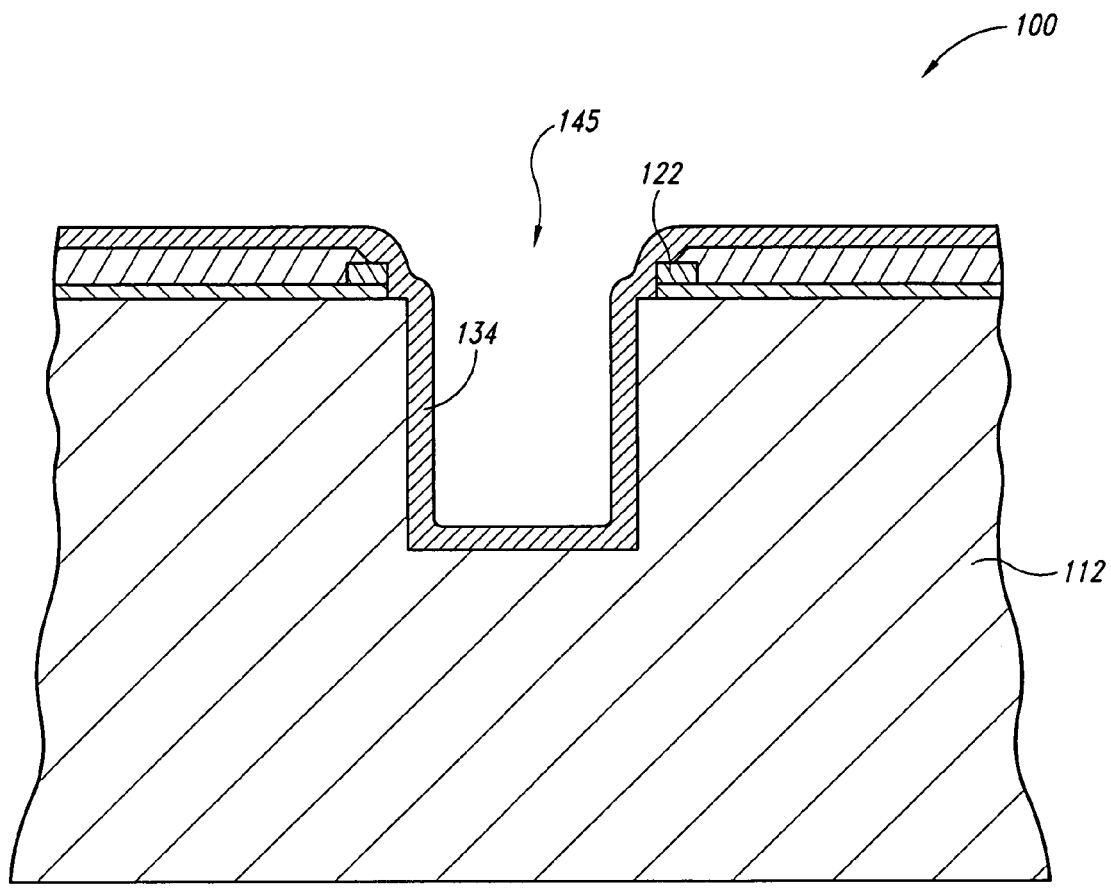
FIGS. 1A-1C illustrate a conventional process of forming an electrically conductive interconnect in accordance with the prior art.
Figure 1B:
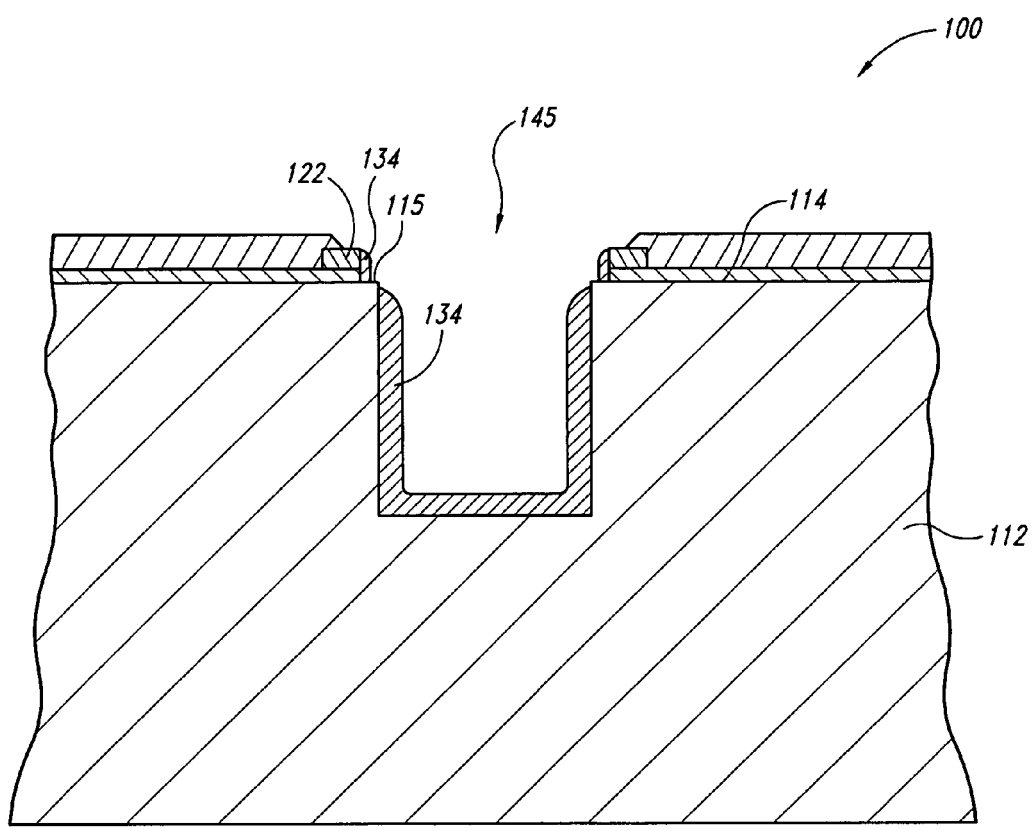
Figure 1C:
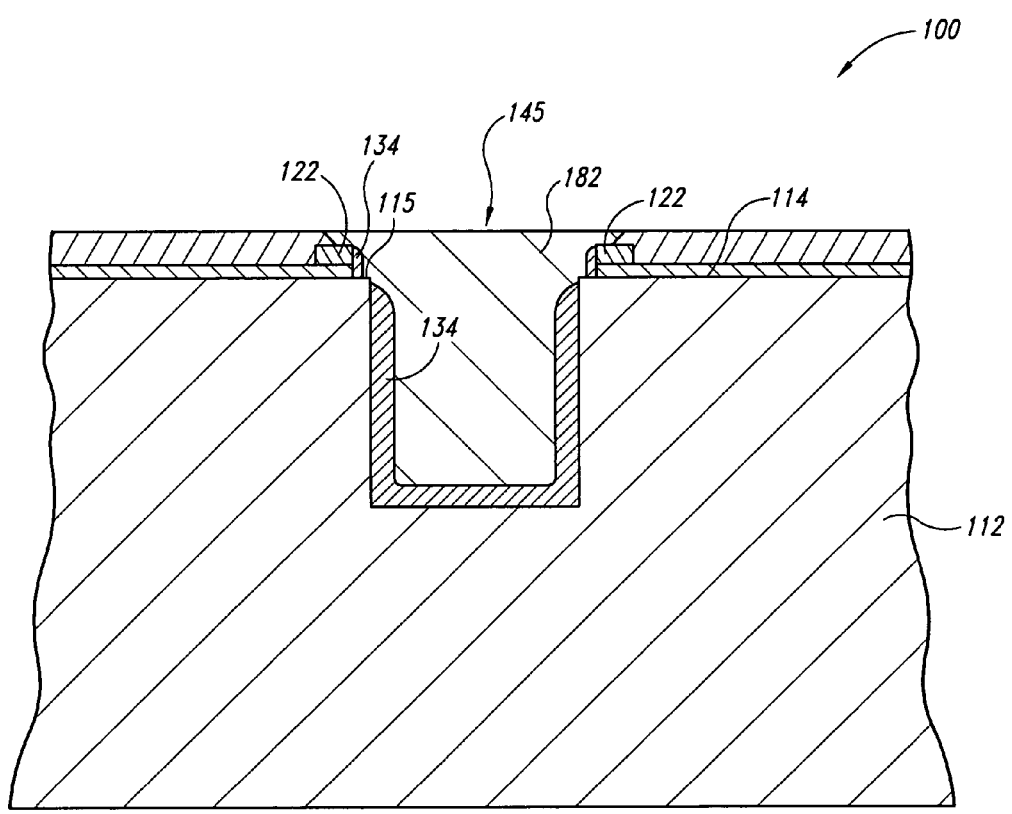

The following disclosure describes several embodiments of methods for forming interconnects in microfeature workpieces, and microfeature workpieces having such interconnects. One aspect of the invention is directed to methods of forming an interconnect in a microfeature workpiece having a substrate, a terminal, and a dielectric layer between the substrate and the terminal. An embodiment of one such method includes forming a hole extending through the terminal and the dielectric layer to at least an intermediate depth in the substrate. The hole has a first lateral dimension in the dielectric layer and a second lateral dimension in the substrate proximate to an interface between the dielectric layer and the substrate. The second lateral dimension is greater than the first lateral dimension. The method further includes constructing an electrically conductive interconnect in at least a portion of the hole and in electrical contact with the terminal.

The hole can be formed by etching the substrate in a first cycle for a first time period to form a first section of the hole in the substrate, and etching the substrate in a second cycle for a second time period to form a second section of the hole in the substrate. The second time period is less than the first time period. Moreover, the hole can be formed by (a) selectively removing a portion of the dielectric layer and a first portion of the substrate with a first process, and (b) selectively removing a second portion of the substrate with a second process. In either case, the hole can be constructed such that the dielectric layer overhangs a section of the hole in the substrate at the interface between the dielectric layer and the substrate. As such, the workpiece includes an undercut in the substrate at the interface between the dielectric layer and the substrate.

In another embodiment, a method includes (a) providing a microfeature workpiece having a substrate, a dielectric layer on the substrate, and a terminal on the dielectric layer, (b) forming a hole in the terminal of the workpiece, and (c) removing a portion of the dielectric layer and a portion of the substrate in a single, generally continuous process. The portion of the dielectric layer and the portion of the substrate are generally aligned with the hole in the terminal and can be removed by etching or other suitable processes.

Another aspect of the invention is directed to microfeature workpieces. In one embodiment, a microfeature workpiece includes a substrate, a dielectric layer on the substrate, a terminal on the dielectric layer, an operable microelectronic feature carried by the substrate and operably coupled to the terminal, and an interconnect via extending through the terminal and the dielectric layer to at least an intermediate depth in the substrate. The interconnect via includes an undercut portion in the substrate at an interface between the dielectric layer and the substrate. The interconnect via can have a first lateral dimension in the dielectric layer and a second lateral dimension in the substrate at an interface between the dielectric layer and the substrate. The second lateral dimension is greater than the first lateral dimension. The microfeature workpiece can further include an electrically conductive interconnect in the interconnect via and in contact with the terminal.

Specific details of several embodiments of the invention are described below with reference to interconnects extending from a terminal proximate to the front side of a workpiece, but the methods and interconnects described below can be used for other types of interconnects within microelectronic workpieces. Several details describing well-known structures or processes often associated with fabricating microelectronic devices are not set forth in the following description for purposes of clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2A-3G. The term "microfeature workpiece" is used throughout to include substrates upon which and/or in which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

B. Embodiments of Methods for Forming Interconnects in Microfeature Workpieces

Figure 2A:
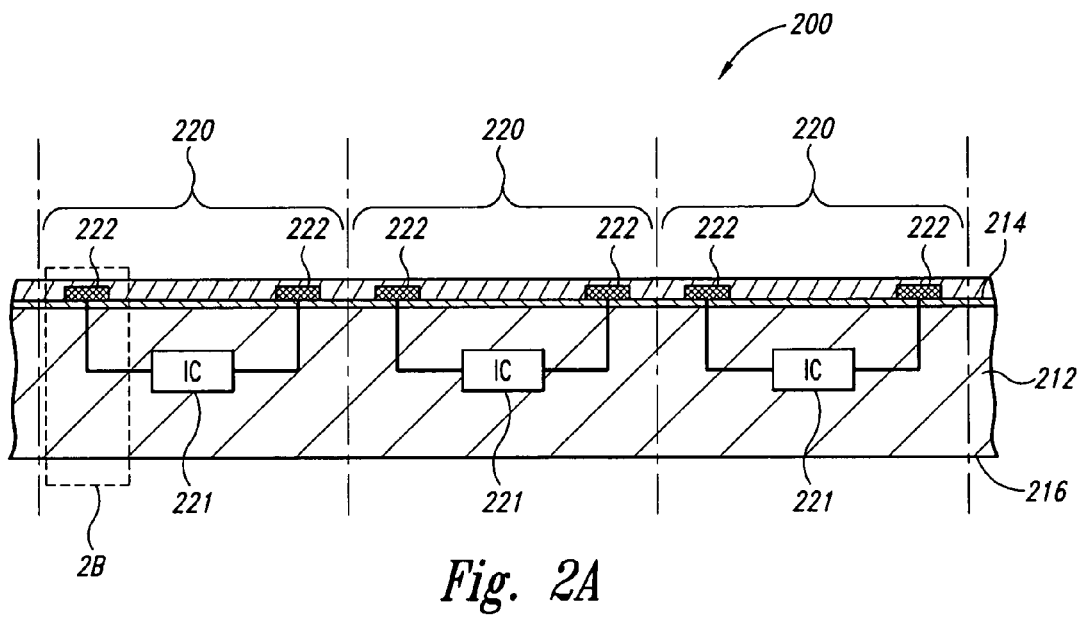
FIGS. 2A-2Q are side cross-sectional views illustrating stages of a method for forming electrically conductive interconnects in a microfeature workpiece in accordance with an embodiment of the invention.
Figure 2B:
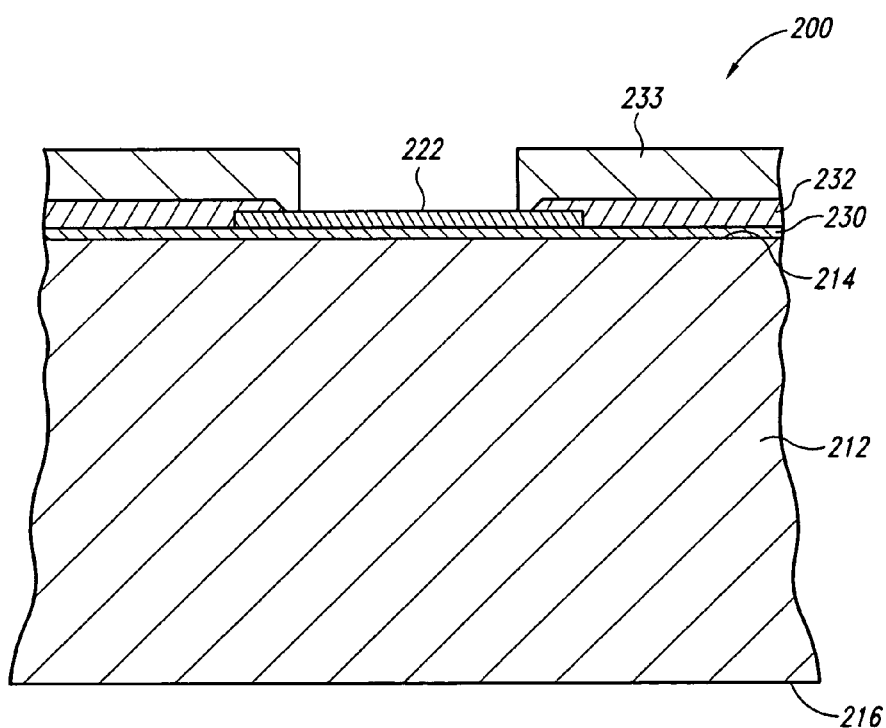
Figure 2C:
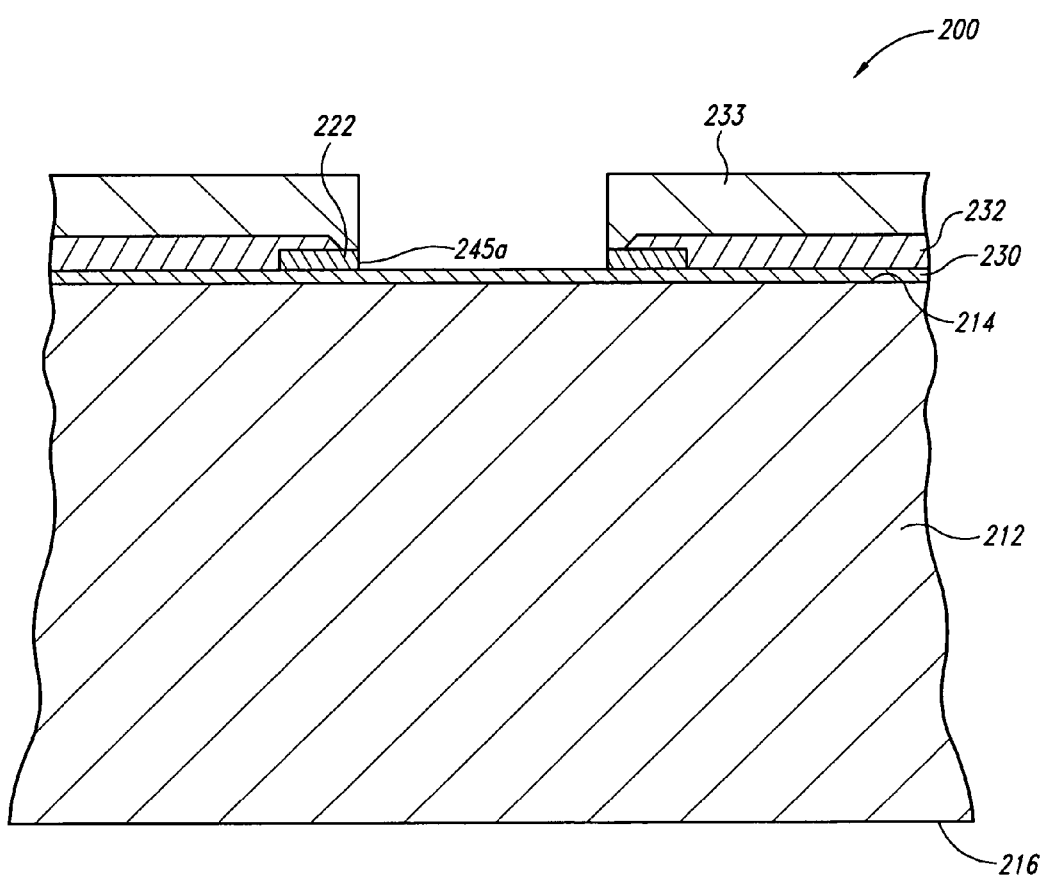
Figure 2D:
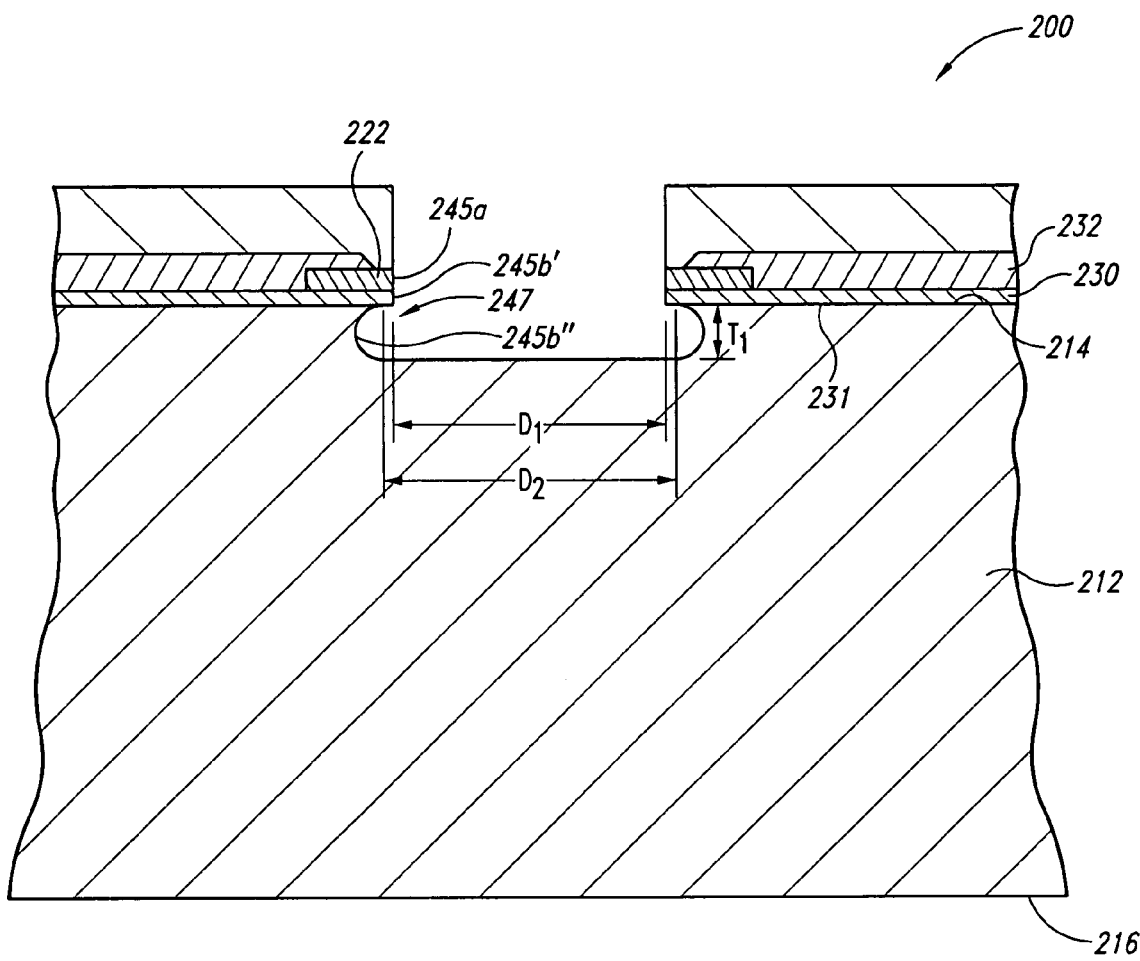
Figure 2E:
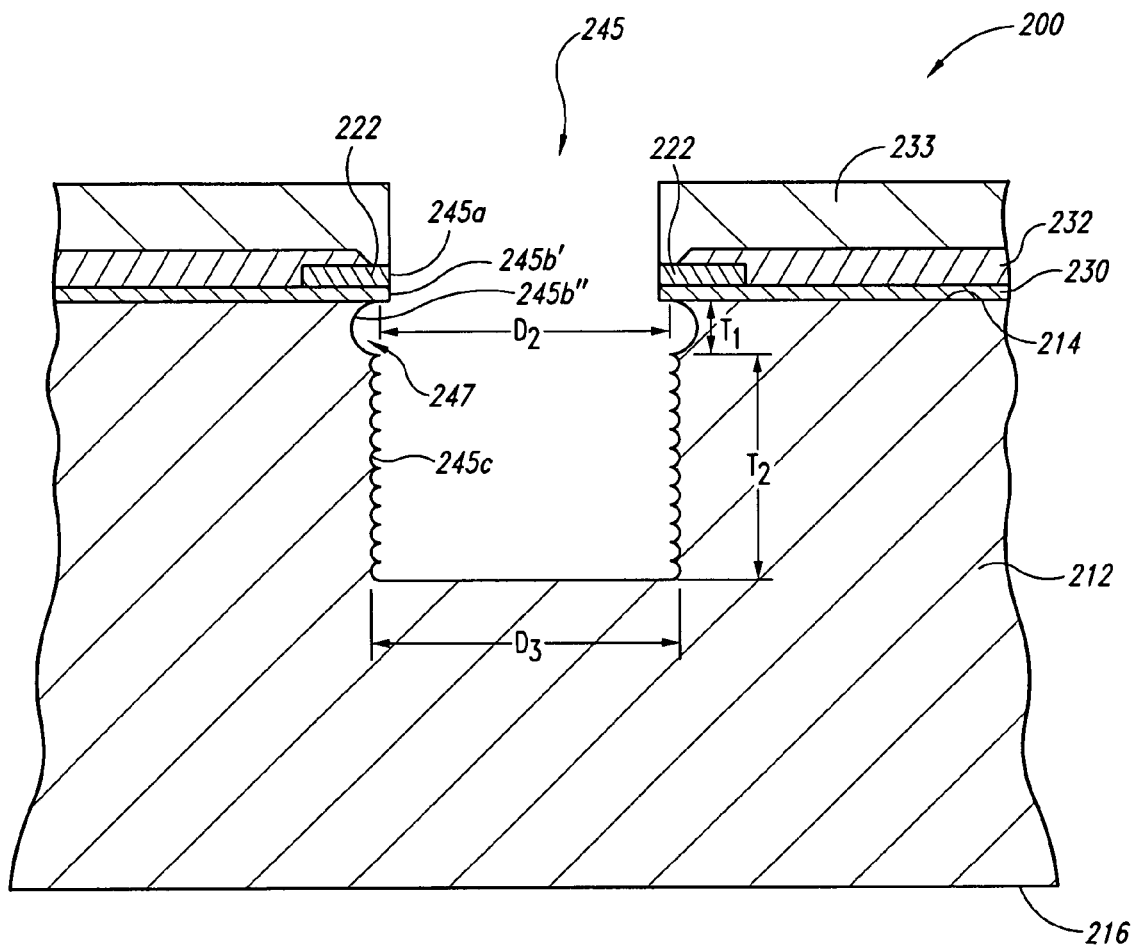
Figure 2F:
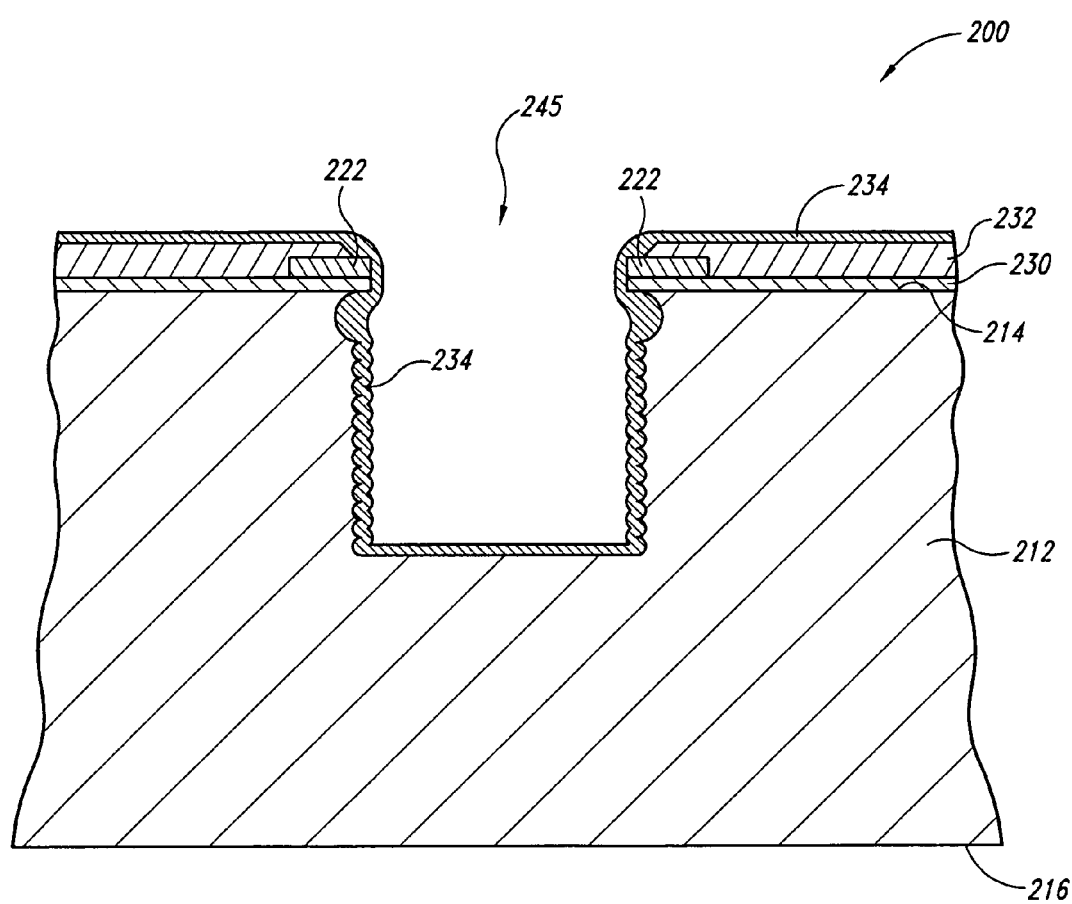
Figure 2G:
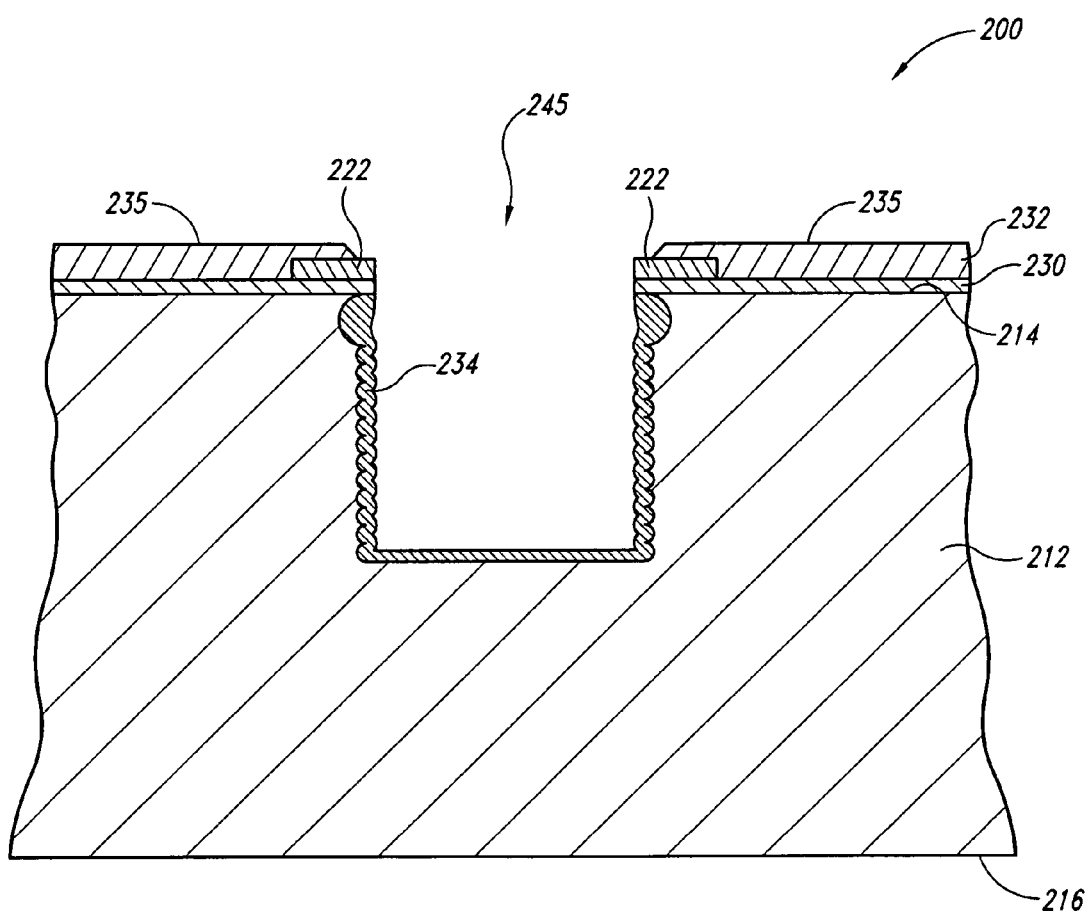
Figure 2H:
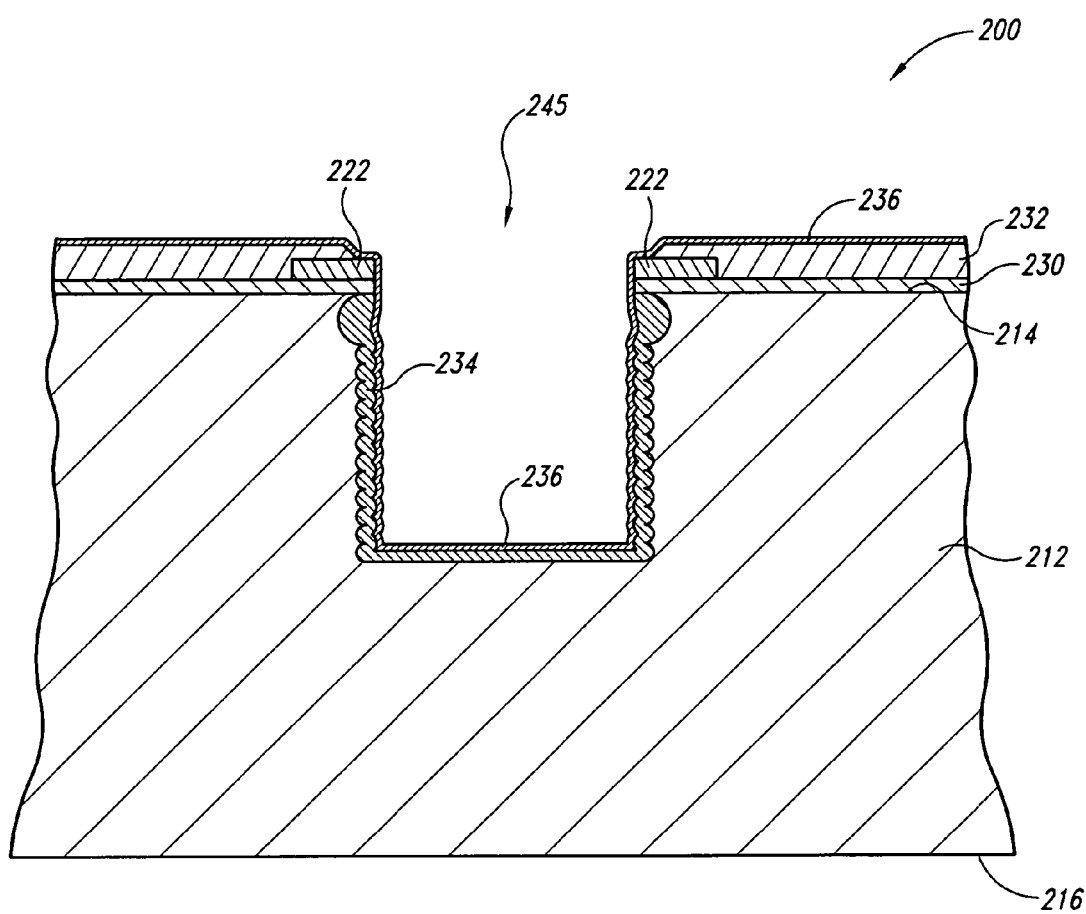
Figure 2I:
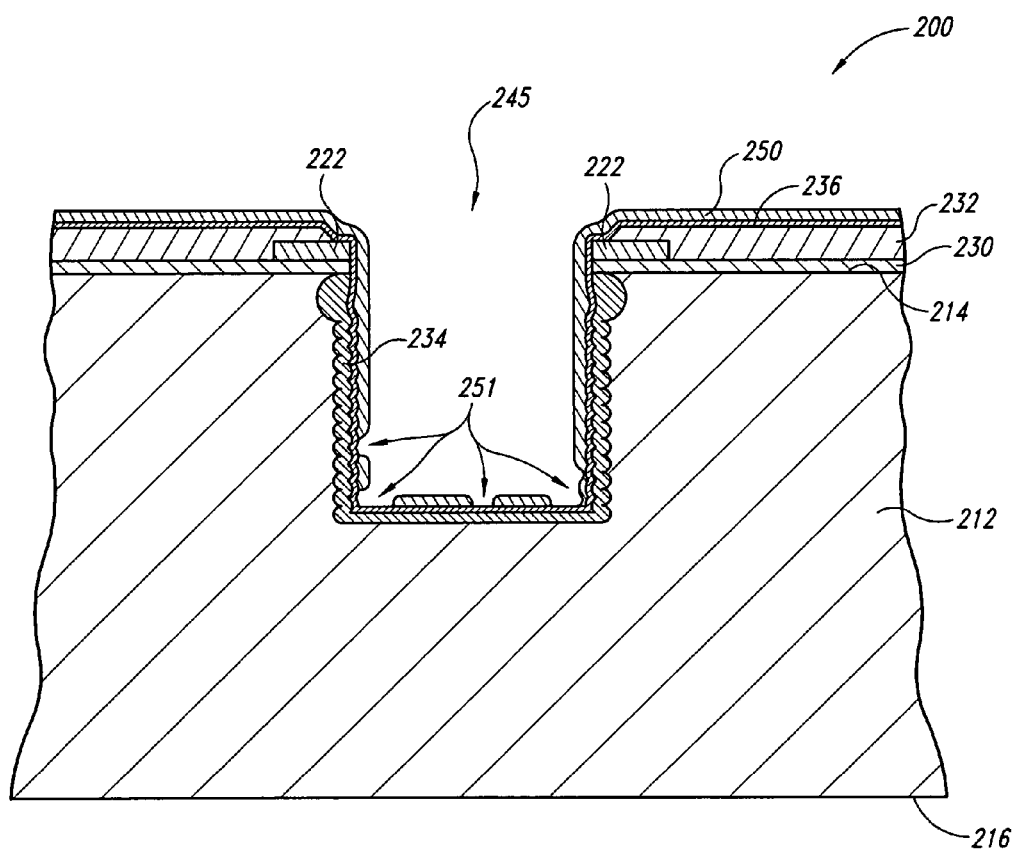
Figure 2J:
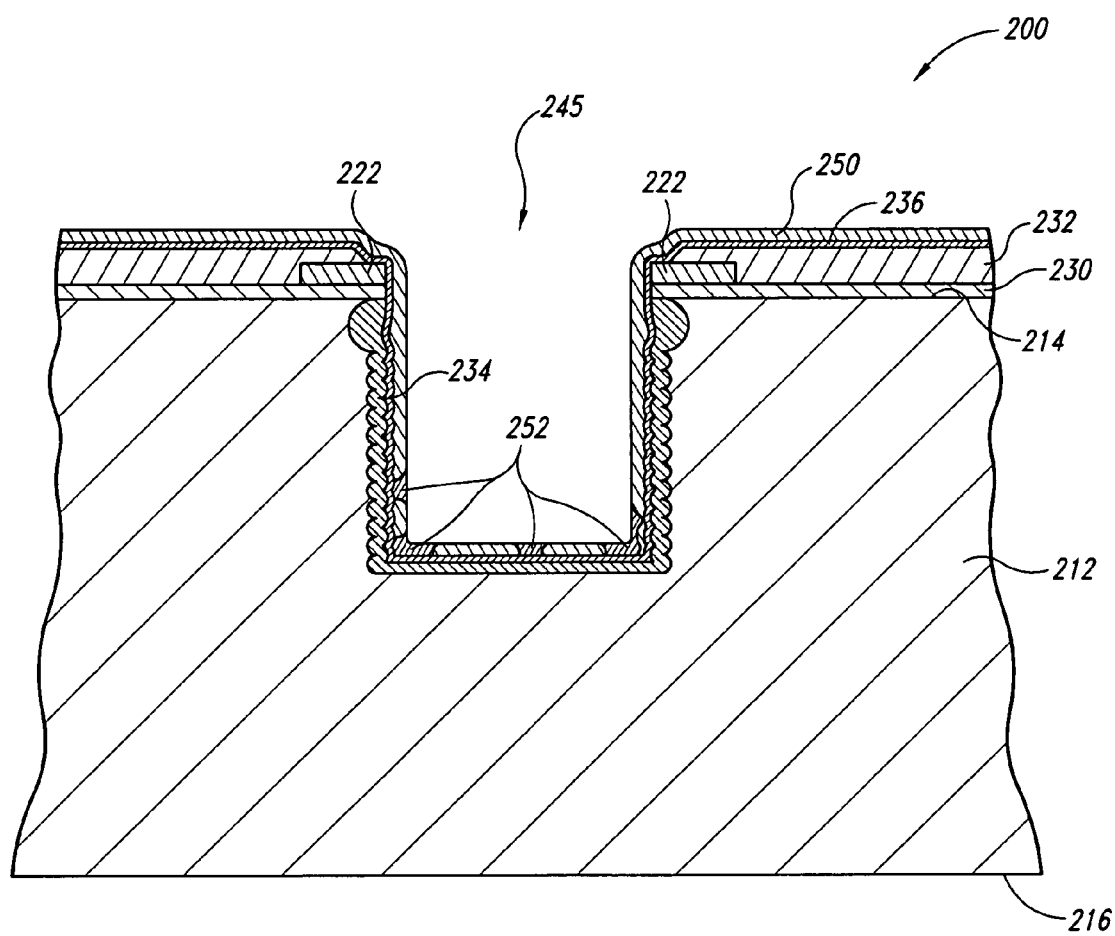
Figure 2K:
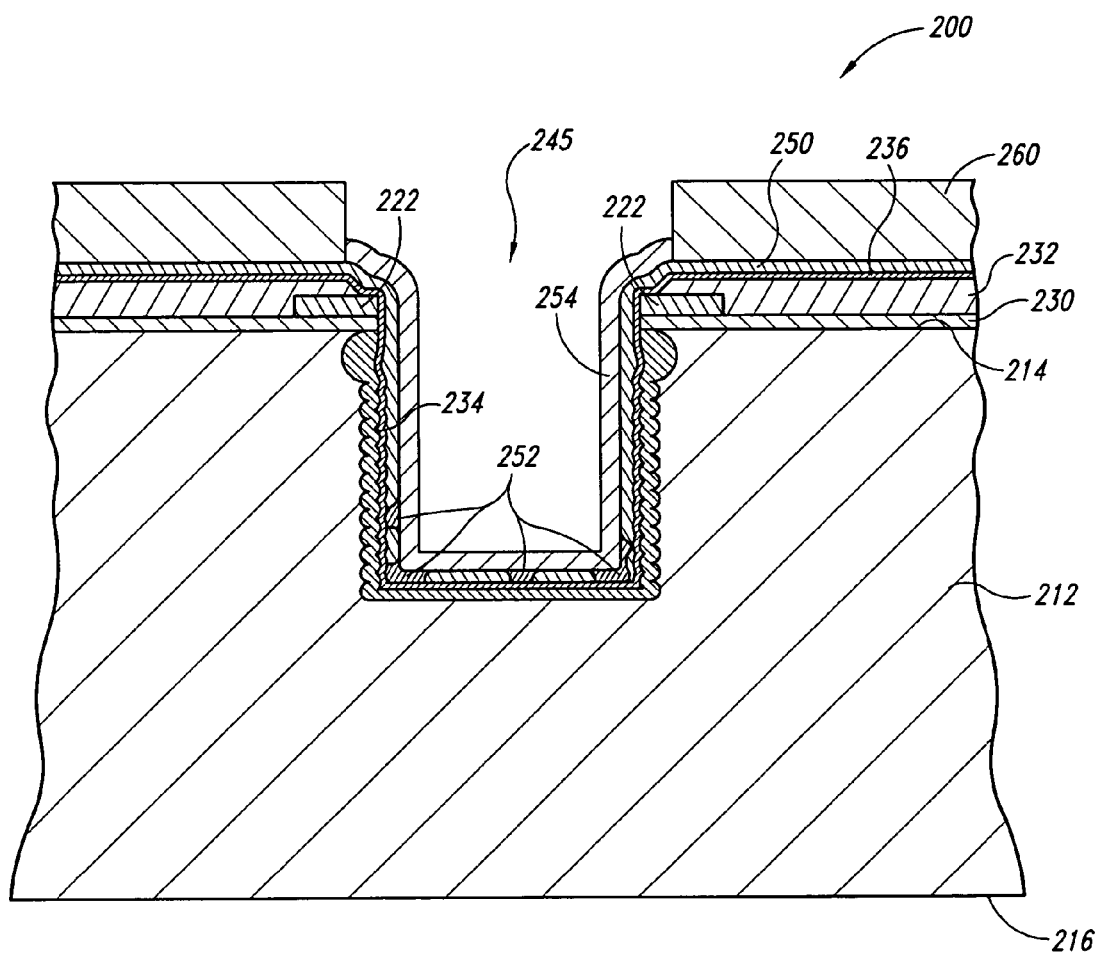
Figure 2L:
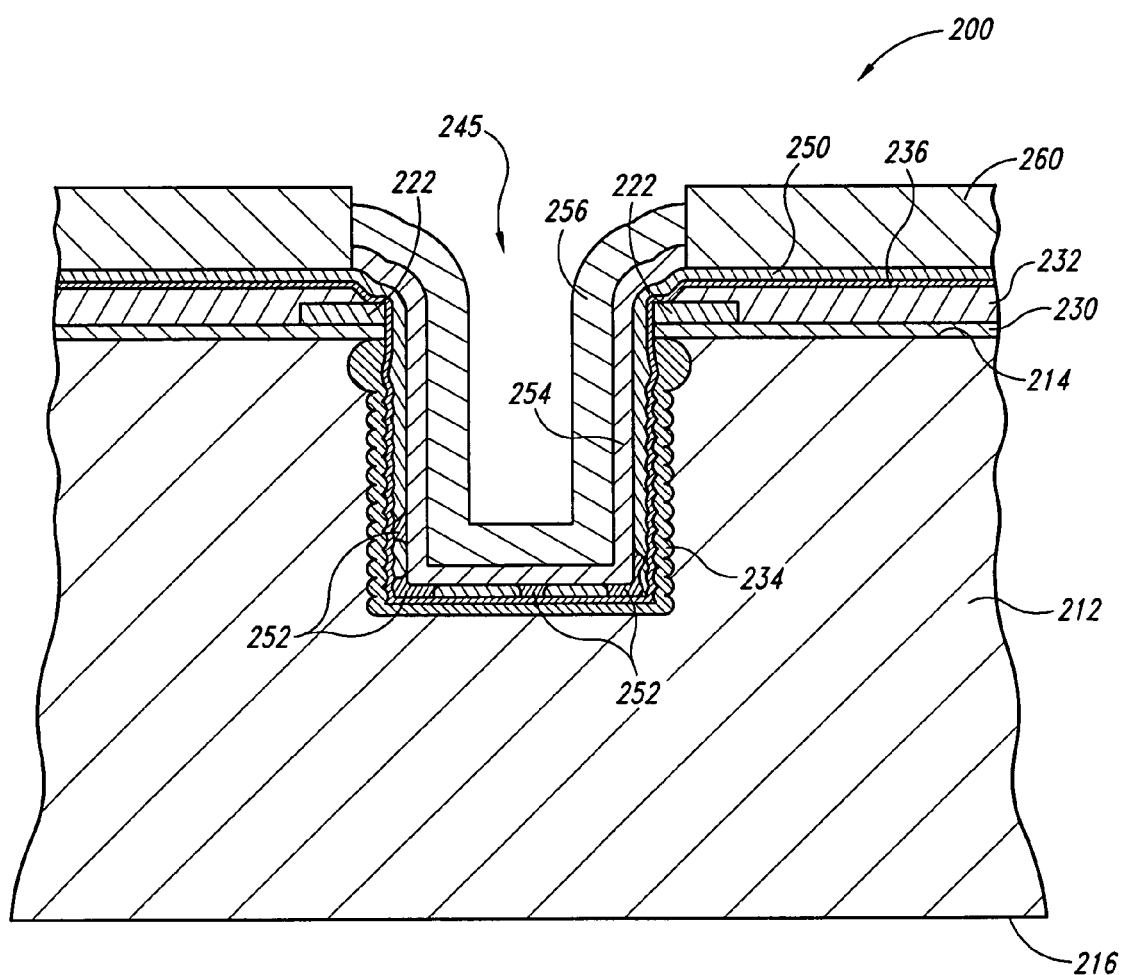
Figure 2M:
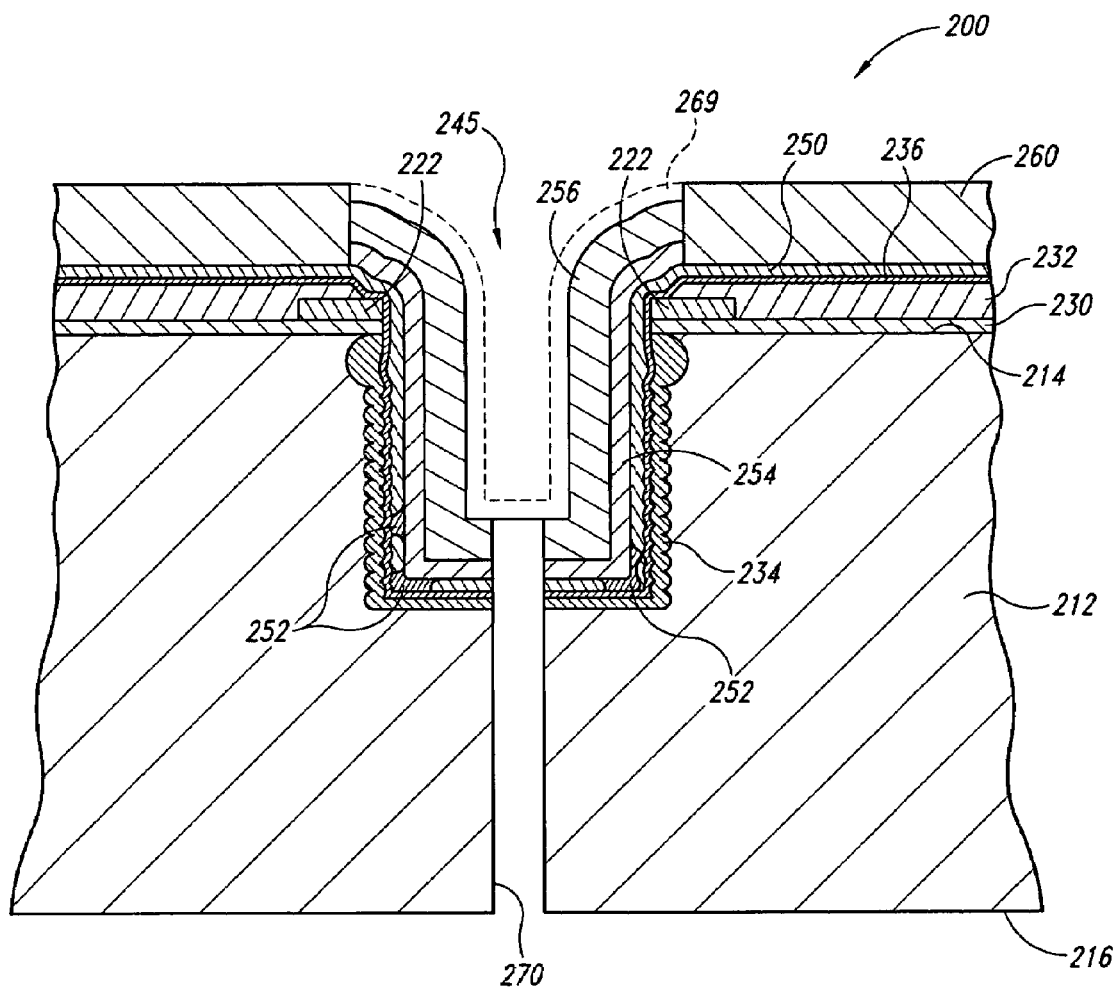
Figure 2N:
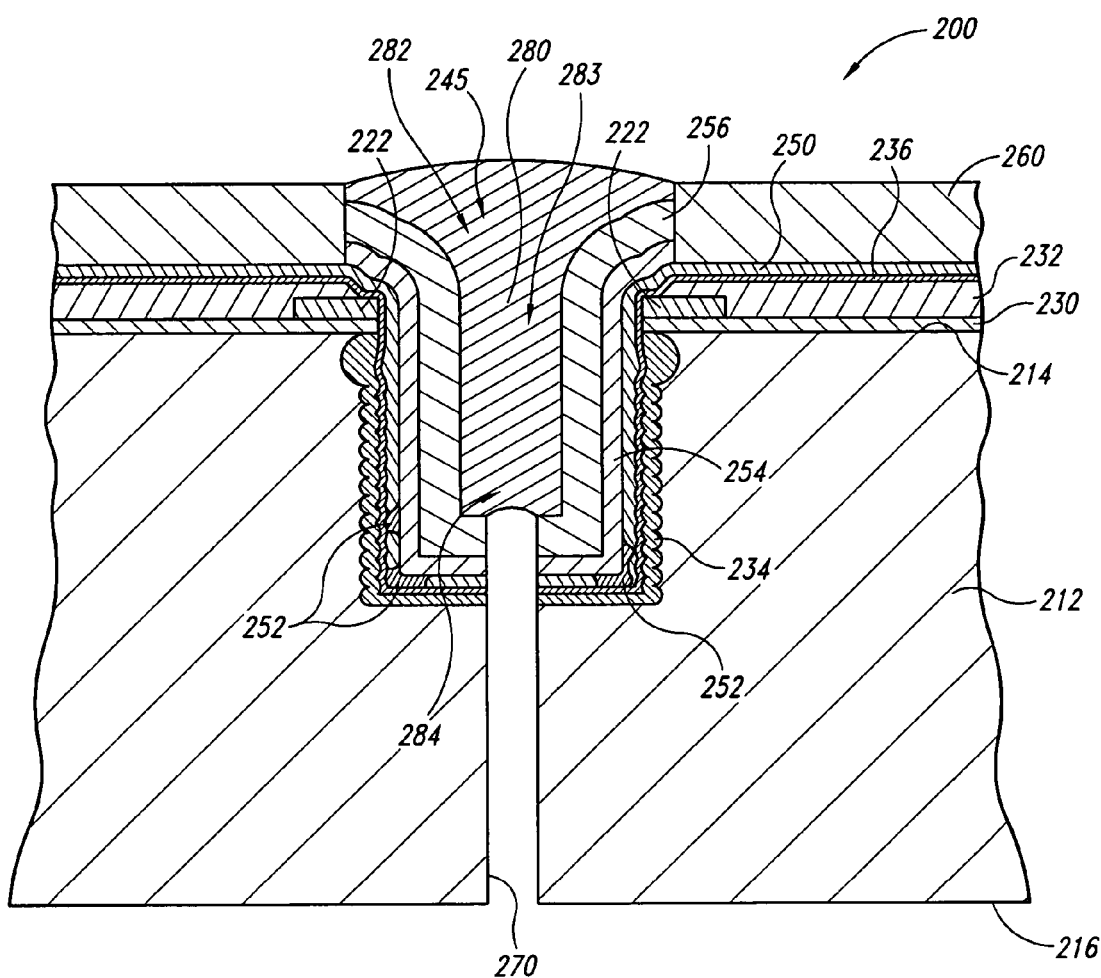
Figure 20:
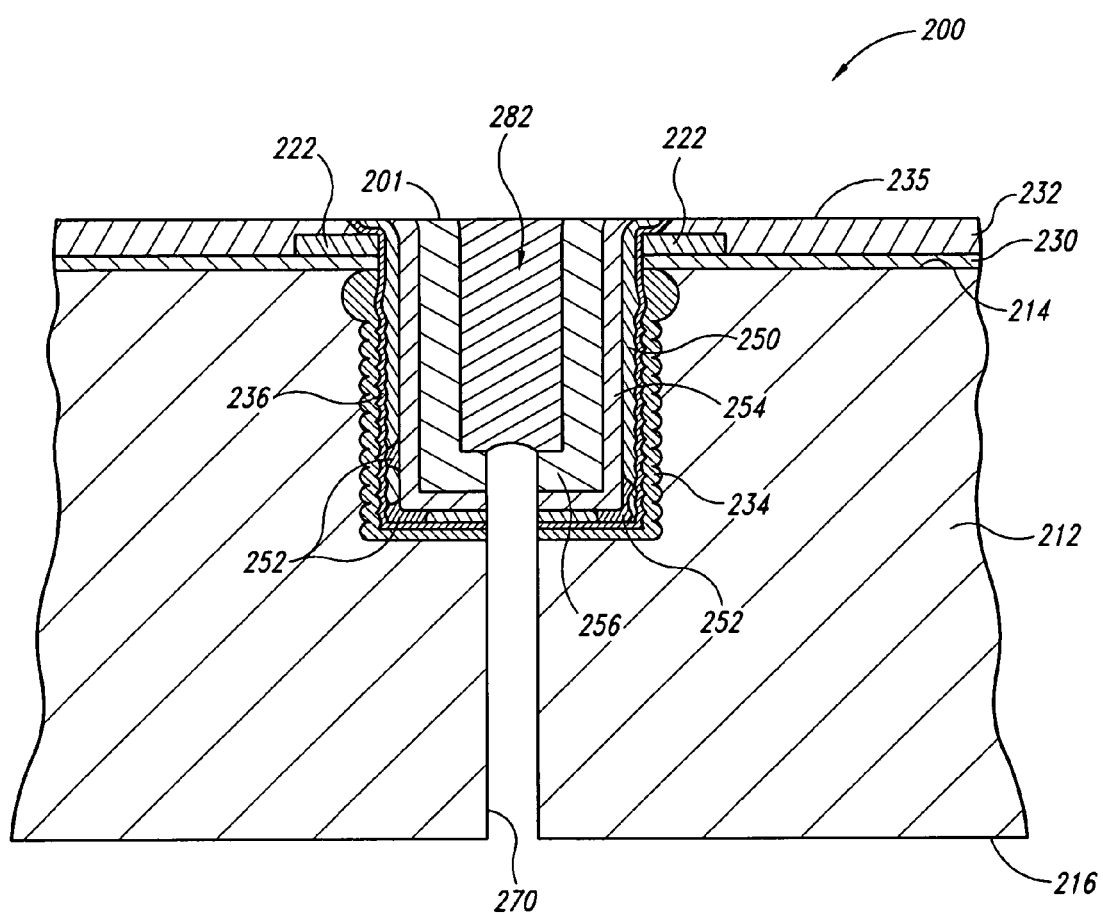
Figure 2P:
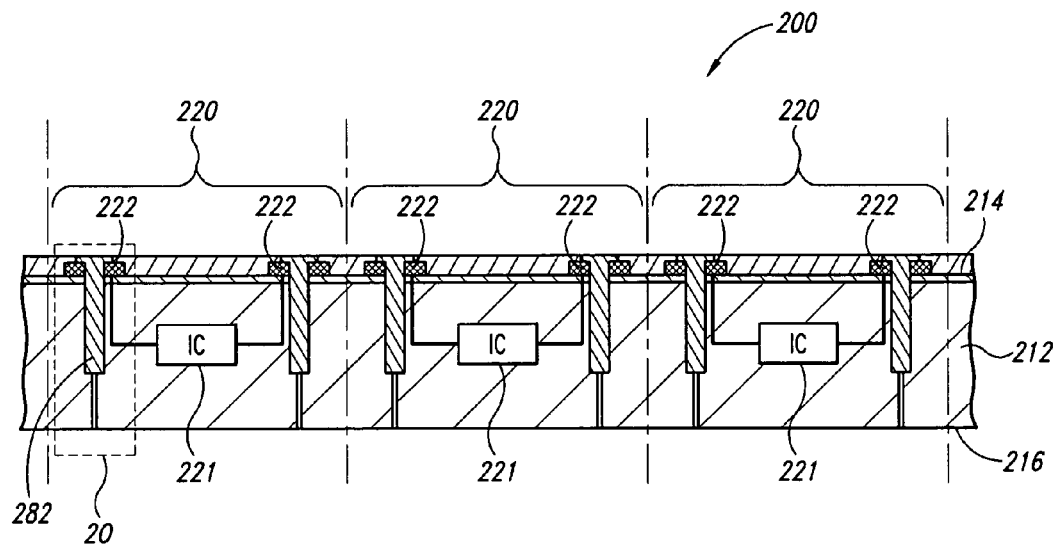
Figure 2Q:
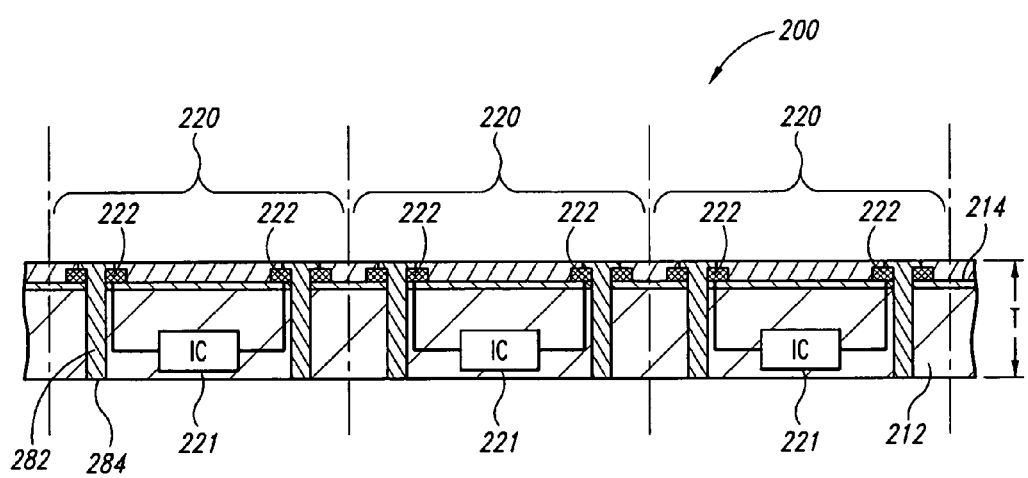

FIGS. 2A-2Q illustrate stages of a method for forming interconnects in a microfeature workpiece 200 in accordance with an embodiment of the invention. FIG. 2A, for example, is a side cross-sectional view of a portion of the workpiece 200 at an initial stage before the interconnects have been formed. The workpiece 200 can include a substrate 212 and a plurality of microelectronic dies 220 formed in and/or on the substrate 212. The substrate 212 has a first side 214 and a second side 216 opposite the first side 214. The substrate 212 is generally a semiconductor wafer, and the dies 220 are arranged in a die pattern on the wafer. The individual dies 220 include integrated circuitry 221 (shown schematically) and a plurality of terminals 222 (e.g., bond-pads) electrically coupled to the integrated circuitry 221. The terminals 222 shown in FIG. 2A are external features at the first side 214 of the substrate 212. In other embodiments, however, the terminals 222 can be internal features that are embedded at an intermediate depth within the substrate 212.

FIG. 2B is a side cross-sectional view of the area 2B shown in FIG. 2A. In previous processing steps, a first dielectric layer 230 was applied to the first side 214 of the substrate 212, and a second dielectric layer 232 was applied over the first dielectric layer 230. The second dielectric layer 232 was then patterned and etched to expose the terminal 222. The dielectric layers 230 and 232 can be a polyimide material or other suitable nonconductive materials. For example, the dielectric layers 230 and 232 can be parylene, a low temperature chemical vapor deposition (low temperature CVD) material such as silicon nitride ($Si_3N_4$), silicon oxide ($SiO_2$), and/or other suitable materials. The foregoing list of dielectric materials is not exhaustive. The dielectric layers 230 and 232 are generally not composed of the same material as each other, but these layers may be composed of the same material. In addition, one or both of the layers 230 and 232 may be omitted and/or additional layers may be included. After depositing the second dielectric layer 232, a mask 233 is applied over the second dielectric layer 232 and patterned as shown in FIG. 2B. The mask 233 can be a layer of resist that is patterned according to the arrangement of terminals 222 on the workpiece 200. As such, the mask 233 has an opening over the terminal 222.

Referring to FIG. 2C, a first hole section 245a has been formed through the terminal 222. The first hole section 245a can be formed using a wet etching or dry etching process that selectively removes material from the terminal 222 and generally does not remove material from the first dielectric layer 230. The first dielectric layer 230 can accordingly be an etch-stop. In embodiments in which the terminal 222 includes more than one type of metal, the etching process can be repeated until the first hole section 245a extends through the terminal 222.

Referring to FIG. 2D, a second hole section 245b (identified as 245' and 245b") has been formed in the first dielectric layer 230 and the substrate 212. The second hole section 245b has a first portion 245b' that extends through the first dielectric layer 230 and a second portion 245b" that extends from the interface of the substrate 212 and the first dielectric layer 230 to a first depth $T_1$ in the substrate 212. The first portion 245b' has a first diameter $D_1$ and is generally aligned with the first hole section 245a in the terminal 222. The second portion 245b" has a second diameter $D_2$ at the interface of the substrate 212 and the first dielectric layer 230. The second diameter $D_2$ is greater than the first diameter $D_1$ such that the second portion 245b" forms an undercut portion 247 in the substrate 212 below the first dielectric layer 230 and exposes a portion of a back surface 231 of the first dielectric layer 230. As a result, the first dielectric layer 230 forms an overhang over the second portion 245b".

In the illustrated method, the second hole section 245b is formed in a single, generally continuous process. For example, the second hole section 245b can be formed in a single dry oxide etch process that, due to the nature of the etchant, tends to anistropically etch the first dielectric layer 230 and isotropically etch the substrate 212. The second etching process for the first dielectric layer 230 and the upper portion of the substrate 212 can be different than the first etching process for the terminal 222. For example, the second etching process can selectively remove material from the first dielectric layer 230 and the substrate 212 at a higher etch rate than from the terminal 222. The second etching process accordingly does not significantly alter the general structure of the terminal 222. In an alternative embodiment, the first and second hole sections 245a-b can be formed using a single etching process.

Table 1 below illustrates one example of a recipe for a suitable second etching process to remove material from the first dielectric layer 230 and the upper portion of the substrate 212.

TABLE 1

| Step 1 | |
|---|---|
| Step end control | BY TIME |
| Maximum step time | 7 seconds |
| Pressure | SERVO 200 MTORR |
| RF power, match, mode | 0 W, AUTO, RF OFF |
| Helium Pressure | 9000 |
| AR | 50 sccm |
| CF4 | 50 sccm |
| CHF3 | 25 sccm |
| NF3 | 45 sccm |
| Step 2 | |
| Step end control | BY TIME |
| Maximum step time | 20 seconds |
| Pressure | SERVO 200 MTORR |
| RF power, match, mode | 1050 W, AUTO, B-to-B |
| Helium Pressure | 9000 |
| AR | 50 sccm |
| CF4 | 50 sccm |
| CHF3 | 20 sccm |
| NF3 | 45 sccm |
| Step 3 | |
| Step end control | BY TIME |
| Maximum step time | 330 seconds |
| Pressure | SERVO 200 MTORR |
| RF power, match, mode | 1050 W, AUTO, RF OFF |
| Helium Pressure | 9000 |
| AR | 50 sccm |
| CF4 | 70 sccm |
| CHF3 | 20 sccm |
| NF3 | 20 sccm |

Referring to FIG. 2E, a third hole section 245c has been formed in the substrate 212. The third hole section 245c has a third diameter $D_3$ that can be greater than, less than, or equal to the second diameter $D_2$. The third diameter $D_3$ of the third hole section 245c is generally a function of the available real estate and processing parameters for subsequent stages. The third hole section 245c extends a second depth $T_2$ into the substrate 212 that is greater than the first depth $T_1$. Although the illustrated first, second, and third hole sections 245a-c define a blind hole 245 that extends through only a portion of the workpiece 200 and is closed at one end, in other embodiments the hole 245 can be through hole that extends completely through the workpiece 200.

The illustrated third hole section 245c is formed by etching the substrate 212 using one or more individual etches, such as a deep silicon etch. After forming the third hole section 245c, the mask 233 is removed from the workpiece 200. The third hole section 245c can alternatively be formed using laser ablation in addition to or in lieu of etching. If a laser is used to form all or a portion of the third hole section 245c, the hole 245 is typically cleaned using chemical cleaning agents to remove slag and/or other contaminants. Etching the entire hole 245 may be easier than laser cutting because the slag does not need to be cleaned from the hole 245 and, in applications in which the hole 245 is a blind hole, the depth of the hole 245 can be more precisely controlled with an etching process. Moreover, blind holes can generally be more precisely aligned using an etching process than a laser cutting process. A further advantage of using an etching process is that the first side 214 of the substrate 212 can be patterned and etched to simultaneously form a plurality of holes 245 aligned with corresponding terminals 222.

Referring next to FIG. 2F, a third dielectric layer 234 is deposited onto the workpiece 200 to line the sidewalls of the hole 245 in the substrate 212. The third dielectric layer 234 electrically insulates components in the substrate 212 from an interconnect that is subsequently formed in the hole 245. In one embodiment, the third dielectric layer 234 can be an ALD (atomic layer deposition) aluminum oxide material applied using a suitable deposition process or another suitable low temperature CVD oxide. In another embodiment, the third dielectric layer 234 can include a silane-based and/or an aluminum-based oxide material. In still further embodiments, the third dielectric layer 234 can include other suitable dielectric materials. Referring to FIG. 2G, a suitable etching process (e.g., a spacer etch) is used to remove the third dielectric layer 234 from at least a portion of the terminal 222 and a first surface 235 of the second dielectric layer 232.

Referring to FIG. 2H, a diffusion barrier layer 236 is then deposited onto the workpiece 200 over the third dielectric layer 234 in the hole 245 and is in electrical contact with the terminal 222. The barrier layer 236 generally covers the second dielectric layer 232 and the terminal 222 in addition to the third dielectric layer 234. In one embodiment, for example, the barrier layer 236 is a layer of tantalum that is deposited onto the workpiece 200 using physical vapor deposition (PVD). The thickness of the barrier layer 236 is about 150 Angstroms. In other embodiments, the barrier layer 236 may be deposited onto the workpiece 200 using other vapor deposition processes, such as CVD, and/or may have a different thickness. The barrier layer 236 is not limited to tantalum, but rather may be composed of tungsten or other suitable materials that help contain the fill material subsequently deposited into the hole 245.

Referring next to FIG. 2I, a seed layer 250 is deposited onto the barrier layer 236. The seed layer 250 can be deposited using vapor deposition techniques, such as PVD, CVD, atomic layer deposition, and/or plating. The seed layer 250 can be composed of Cu or other suitable materials. The thickness of the seed layer 250 may be about 2000 Angstroms, but could be more or less depending upon the depth and aspect ratio of the hole 245. In several embodiments, the seed layer 250 may not uniformly cover the barrier layer 236 such that the seed layer 250 has voids 251 within the hole 245. This can cause non-uniform electroplating in the hole 245 and across the workpiece 200. When the seed layer 250 is deficient, it is preferably enhanced using a process that fills voids or noncontinuous regions of the seed layer 250 to form a more uniform seed layer. Referring to FIG. 2J, for example, voids 251 and/or noncontinuous regions of the seed layer 250 have been filled with additional material 252, such as copper or another suitable material. One suitable seed layer enhancement process is described in U.S. Pat. No. 6,197,181, which is incorporated herein by reference.

Referring next to FIG. 2K, a resist layer 260 is deposited onto the seed layer 250 and patterned to have an opening 261 over the terminal 222 and corresponding hole 245. A first conductive layer 254 is then deposited onto the exposed portions of the seed layer 250 in the hole 245. The first conductive layer 254 can be Cu that is deposited onto the seed layer 250 in an electroless plating operation, electroplating operation, or another suitable method. In the illustrated embodiment, the thickness of the first conductive layer 254 is about 1 micron. In other embodiments, the first conductive layer 254 may include other suitable materials and/or have a different thickness.

Referring to FIG. 2L, a second conductive layer 256 is deposited onto the first conductive layer 254 in the hole 245. The second conductive layer 256 is a wetting agent that facilitates depositing subsequent materials into the hole 245. The second conductive layer 256 can be Ni that is deposited onto the first conductive layer 254 using an electroless or electrolytic plating process. In the illustrated embodiment, the thickness of the second conductive layer 256 is approximately 3-5 microns. In other embodiments, the hole 245 may be coated with other suitable materials using other methods and/or have a different thickness.

Referring next to FIG. 2M, a vent hole 270 is formed in the substrate 212 extending from a bottom portion of the hole 245 to the second side 216 of the substrate 212. The vent hole 270 can be formed using a laser to cut through the substrate 212 from the second side 216 to the bottom of the hole 245. The laser can be aligned with the hole 245 and/or corresponding terminal 222 using scanning/alignment systems known in the art. A suitable laser is the Xise200 commercially available from Xsil Ltd. of Dublin, Ireland. After forming the vent hole 270, the hole 270 is generally cleaned to remove ablated byproducts (i.e., slag) and/or other undesirable byproducts resulting from the laser. For example, the vent hole 270 can be cleaned using a suitable cleaning agent, such as 6% tetramethylammonium hydroxide (TMAH): propylene glycol. In other embodiments, the vent hole 270 may not be cleaned. In alternative embodiments, the vent hole 270 can be a different size or shape, and may be formed using an etching process (e.g., a dry etch and/or a wet etch), a mechanical drilling process, a dicing or laser slot, or another suitable method. In embodiments in which the hole 245 is a through hole, the substrate may not include a vent hole.

In several embodiments, a temporary protective filling or coating 269 (shown in broken lines) can be deposited into the hole 245 before forming the vent hole 270. The protective filling 269 can be a photoresist, a polymer, water, a solidified liquid or gas, or another suitable material. The protective filling 269 protects the sidewalls of the hole 245 from slag produced during the laser drilling process. The slag can negatively affect the plating of Ni onto the seed layer 250 and/or the wetting of a conductive fill material into the hole 245. The protective filling 269 can be removed after forming the vent hole 270.

Referring next to FIG. 2N, a conductive fill material 280 is deposited into the hole 245 to form an interconnect 282. The interconnect 282 has a first end 283 proximate to the terminal 222 and a second end 284 at the bottom of the hole 245. The fill material 280 can include Cu, Ni, Co, Ag, Au, SnAgCu solder, AuSn solder, a solder having another composition, or other suitable materials or alloys of materials having the desired conductivity. The conductive fill material 280 can be deposited into the blind hole 245 using plating processes, solder wave processes, screen printing processes, reflow processes, vapor deposition processes, or other suitable techniques. The plating processes, for example, can be electroless plating processes or electroplating processes. In several embodiments, the barrier layer 236 and/or seed layer 250 can be used as electroplating contacts.

Referring to FIG. 2O, the resist layer 260 is removed from the workpiece 200 and a suitable etching process is used to remove the remaining portions of the seed layer 250 and the barrier layer 236 on the first surface 235 of the second dielectric layer 232. A first surface 201 of the workpiece 200 can then be planarized using grinding, chemical-mechanical planarization (CMP), and/or other suitable processes.

FIG. 2P is a side cross-sectional view of the workpiece 200 with multiple interconnects 282 formed at corresponding terminals 222 of the dies 220. Referring to FIG. 2Q, the workpiece 200 can be thinned to a desired thickness T to expose the second ends 284 of the interconnects 282. In one embodiment, the initial thickness of the substrate 212 is approximately 750 microns, and the final thickness T is approximately 100-500 microns. The initial and final thicknesses can be different in other embodiments. The second side 216 of the substrate 212 can be thinned by grinding, dry etching, chemical etching, chemical polishing, CMP, or other suitable processes.

The general knowledge of the art before the present invention understood that undercutting into a substrate when forming a through-wafer interconnect hole was undesirable for several reasons. First, undercutting into the substrate increased the time necessary to etch through the oxide or first dielectric layer. Second, the undercut was difficult to cover with dielectric material and increased the likelihood that the interconnect would contact the substrate and cause a short. Third, the undercut could collect containments that cause defects in the devices. As a result, conventional processes of forming through-wafer interconnects did not include undercutting the substrate.

The present inventors, however, have discovered that forming an undercut in a substrate when forming a through-wafer interconnect can be advantageous in certain applications. For example, one advantage of several embodiments of the method for forming interconnects 282 illustrated in FIGS. 2A-2Q is that the resulting interconnect 282 is electrically isolated from the substrate 212. Specifically, the illustrated method forms a hole 245 with an undercut portion 247 at the interface of the first dielectric layer 230 and the substrate 212, and deposits a third dielectric layer 234 in the hole 245. When portions of the third dielectric layer 234 are removed from the terminal 222 and the first surface 235 of the second dielectric layer 232, the portion of the third dielectric layer 234 in the undercut portion 247 of the hole 245 is either not removed or the removed material is insufficient to expose the substrate 212. Because the portion of the substrate 212 in the hole 245 is covered by the third dielectric layer 234 and not exposed, the substrate 212 is electrically isolated from the interconnect 282, which prevents shorting between the substrate 212 and the terminal 222.

Moreover, the method illustrated in FIGS. 2A-2Q forms an interconnect 282 that is electrically isolated from the substrate 212 without significantly increasing the processing time. In several applications, the processing time is expected to be faster than the time required in conventional methods because the time spent forming the undercut portion 247 reduces the time required to form the remainder of the hole 245 in the substrate 212.

Figure 3A:
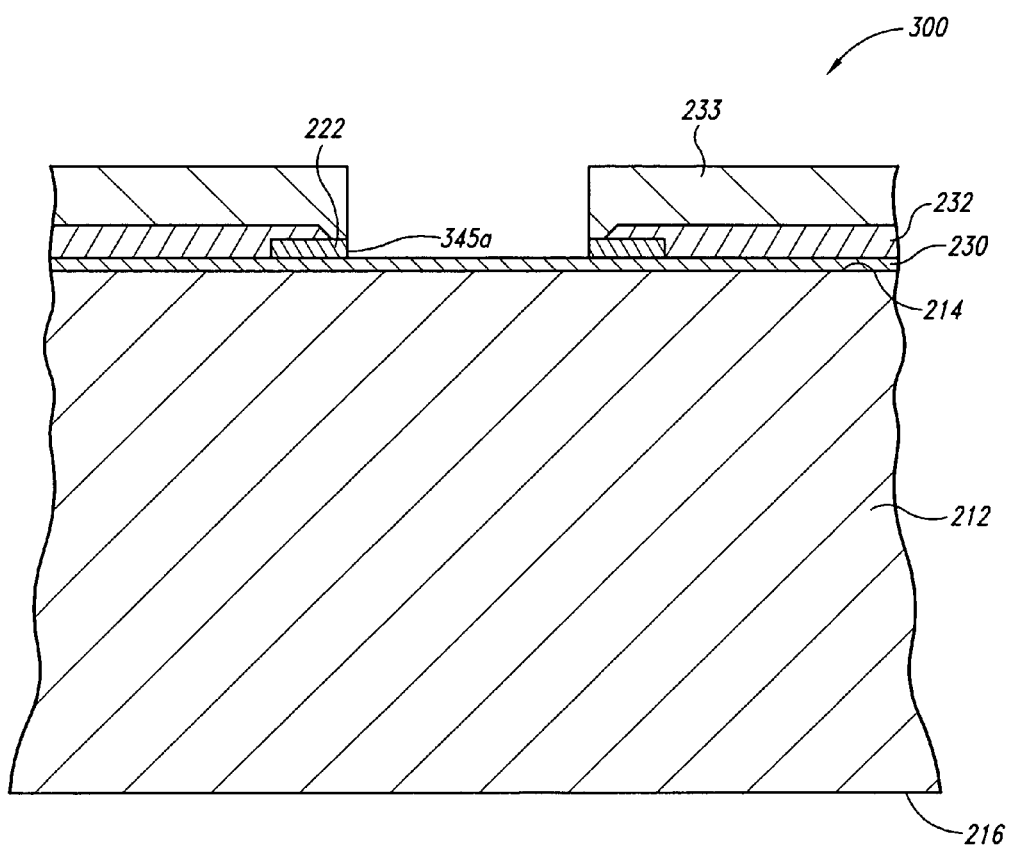
FIGS. 3A-3G are side cross-sectional views illustrating stages of a method for forming electrically conductive interconnects in a microfeature workpiece in accordance with another embodiment of the invention.

C. Additional Embodiments of Methods for Forming Interconnects in Microfeature Workpieces FIGS. 3A-3G illustrate stages in a method for forming interconnects in a microfeature workpiece 300 in accordance with another embodiment of the invention. FIG. 3A, for example, is a side cross-sectional view of a portion of the workpiece 300 at an initial stage before the interconnects have been formed. In previous process steps, such as the steps described above with reference to FIGS. 2A-2C, first and second dielectric layers 230 and 232 have been deposited onto the substrate 212, and a first hole section 345a has been formed through the terminal 222.

Figure 3B:
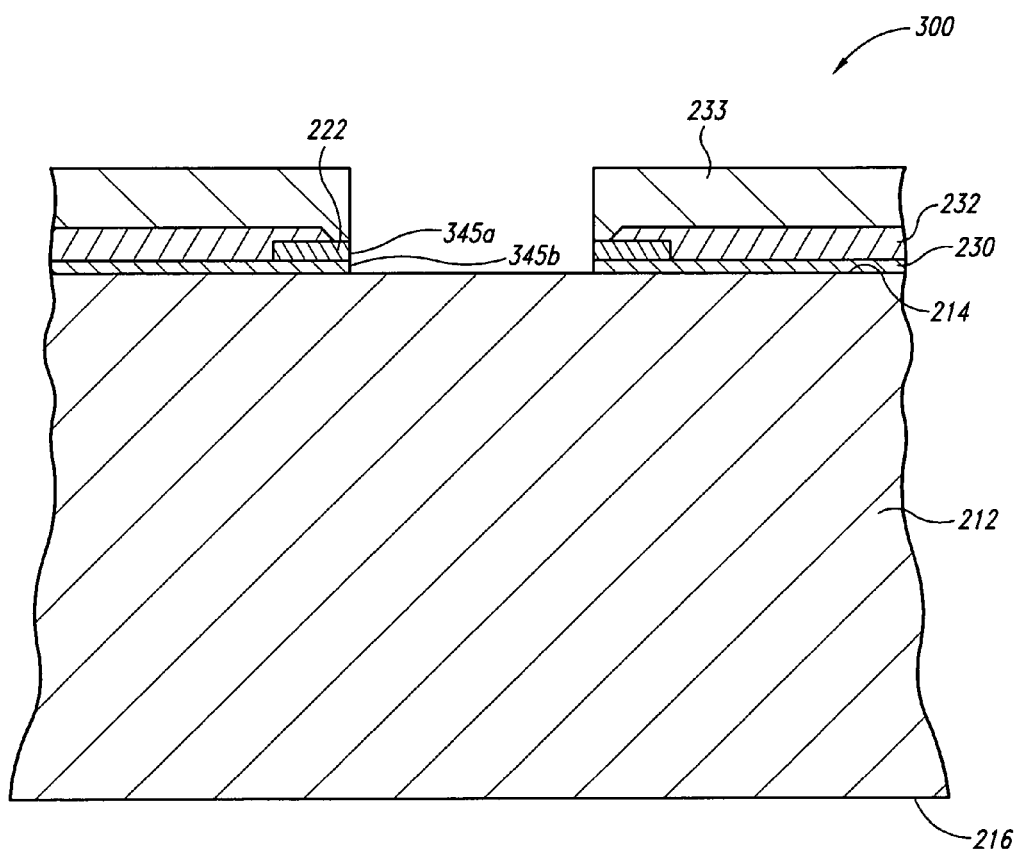
Figure 3C:
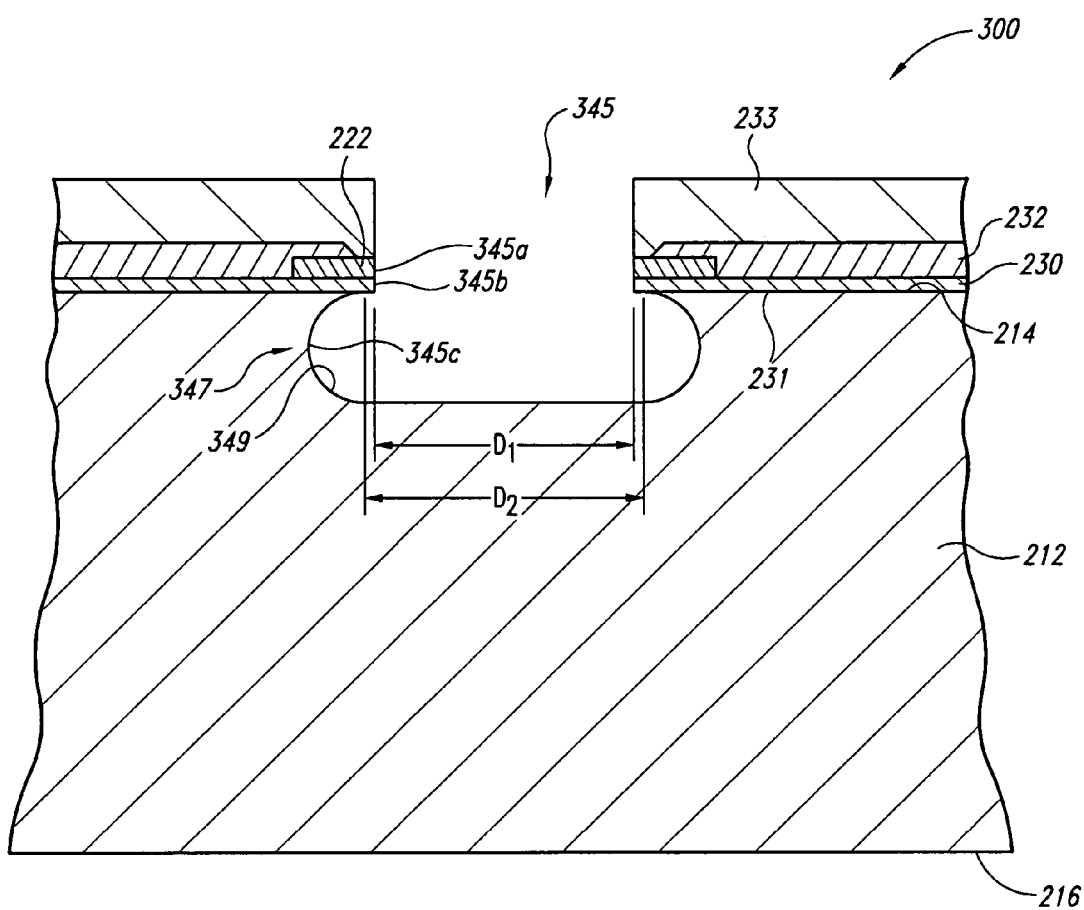

Referring to FIG. 3B, the first dielectric layer 230 directly beneath the terminal 222 is etched to expose at least a portion of the substrate 212 and form a second hole section 345b generally aligned with the first hole section 345a. The second etching process for removing material from the first dielectric layer 230 can be different than the first etching process for removing material from the terminal 222. For example, the second etching process can selectively remove material from the first dielectric layer 230 at a higher etch rate than from either the terminal 222 or the substrate 212. The second etching process accordingly does not significantly alter the general structure of the terminal 222 or the substrate 212. In other embodiments, however, material can be removed from the terminal 222 and the first dielectric layer 230 in a single etching process.

FIGS. 3C-3G illustrate a technique, typically referred to as a Bosch process, for forming a hole 345 in the substrate 212. Beginning with FIG. 3C, the mask 233 is used again on the workpiece 300 to form a third hole section 345c through a portion of the substrate 212 in a first etching cycle. The second hole section 345b has a first diameter $D_1$, and the third hole section 345c has a second diameter $D_2$ at the interface between the first dielectric layer 230 and the substrate 212. The second diameter $D_2$ is greater than the first diameter $D_1$ such that the third hole section 345c forms an undercut portion 347 in the substrate 212 below the first dielectric layer 230 and exposes a back surface 231 of the first dielectric layer 230. As a result, the first dielectric layer 230 forms an overhang over the third hole section 345c. The first etching cycle forms a generally cylindrical sidewall 349 that has a barrel-type shape (exaggerated in the figures for purposes of illustration).

Figure 3D:
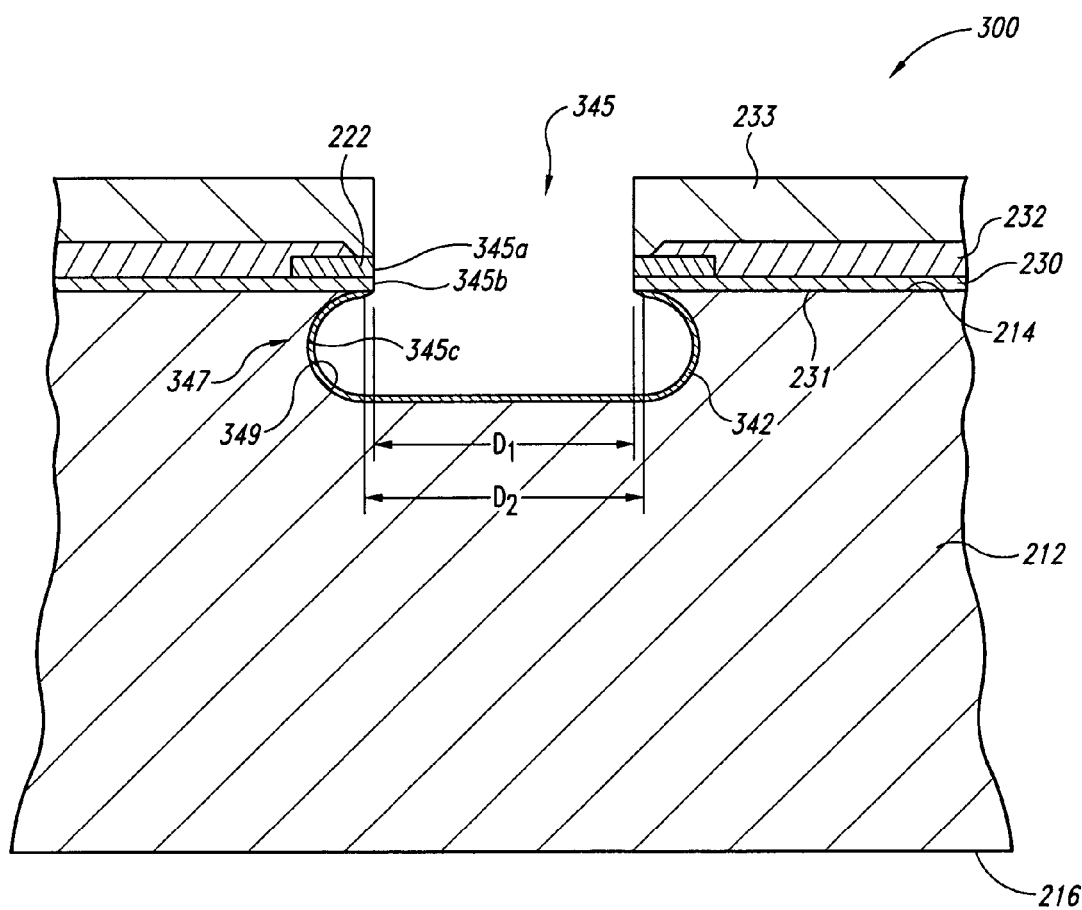

Referring next to FIG. 3D, a third dielectric layer 342 is formed on the sidewall 349 to passivate the third hole section 345c in the substrate 212. The third dielectric layer 342 can be a teflon-like polymer or other suitable materials. The third dielectric layer 342 accordingly inhibits the third hole section 345c from becoming further widened as the hole 345 is deepened.

Figure 3E:
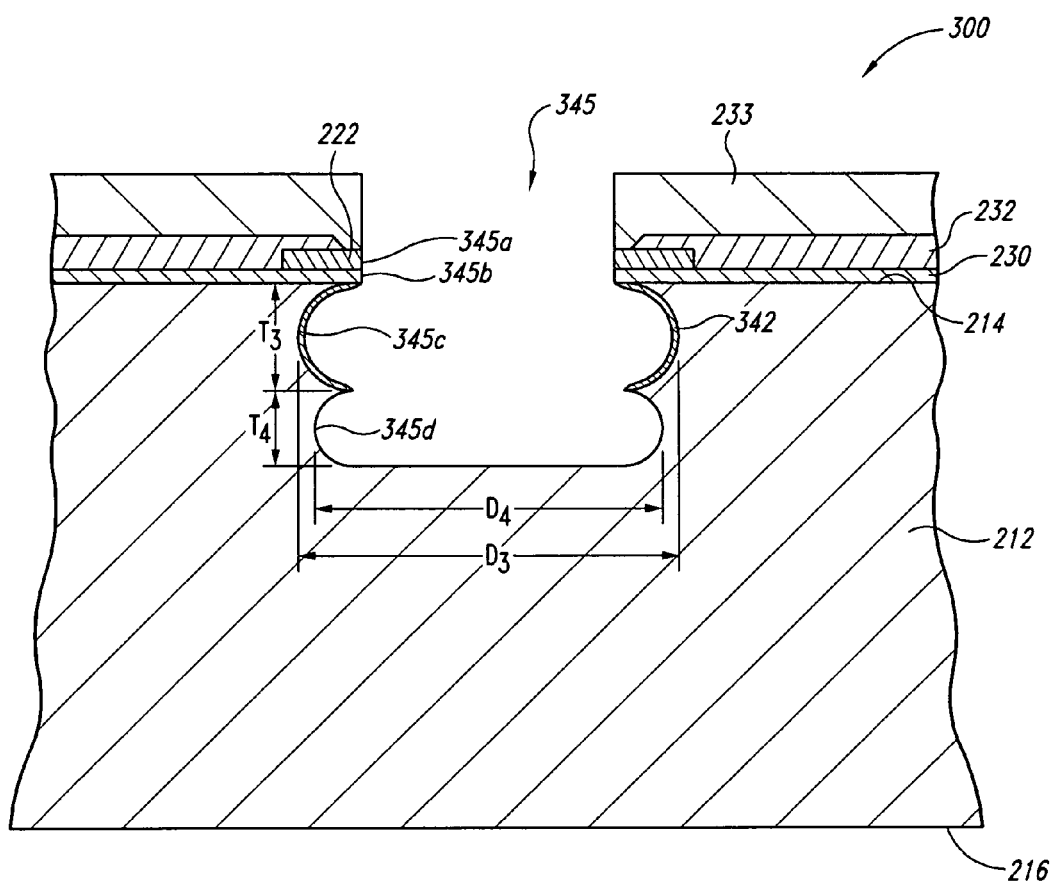

Referring next to FIG. 3E, a fourth hole section 345d has been formed in the substrate 212 below the third hole section 345c by a second etching cycle. In the illustrated embodiment, the third hole section 345c has a third major lateral dimension $D_3$ and a third depth $T_3$, and the fourth hole section 345d has a fourth major lateral dimension $D_4$ less than the third major lateral dimension $D_3$ and a fourth depth $T_4$ less than the third depth $T_3$. In the illustrated method, the second etching cycle has different process parameters than the first etching cycle that formed the third hole section 345c. For example, the first etching cycle can include exposing the substrate 212 to an etchant (e.g., $SF_6$) for a first process time, and the second etching cycle can include exposing the substrate 212 to the etchant for a second process time less than the first process time. In other embodiments, the first and second etching cycles can have the same exposure time but use different etchants or vary other process parameters. In additional embodiments, the first and second etching cycles can be generally the same, and the third and fourth hole sections 345c-d have generally the same size.

Figure 3F:
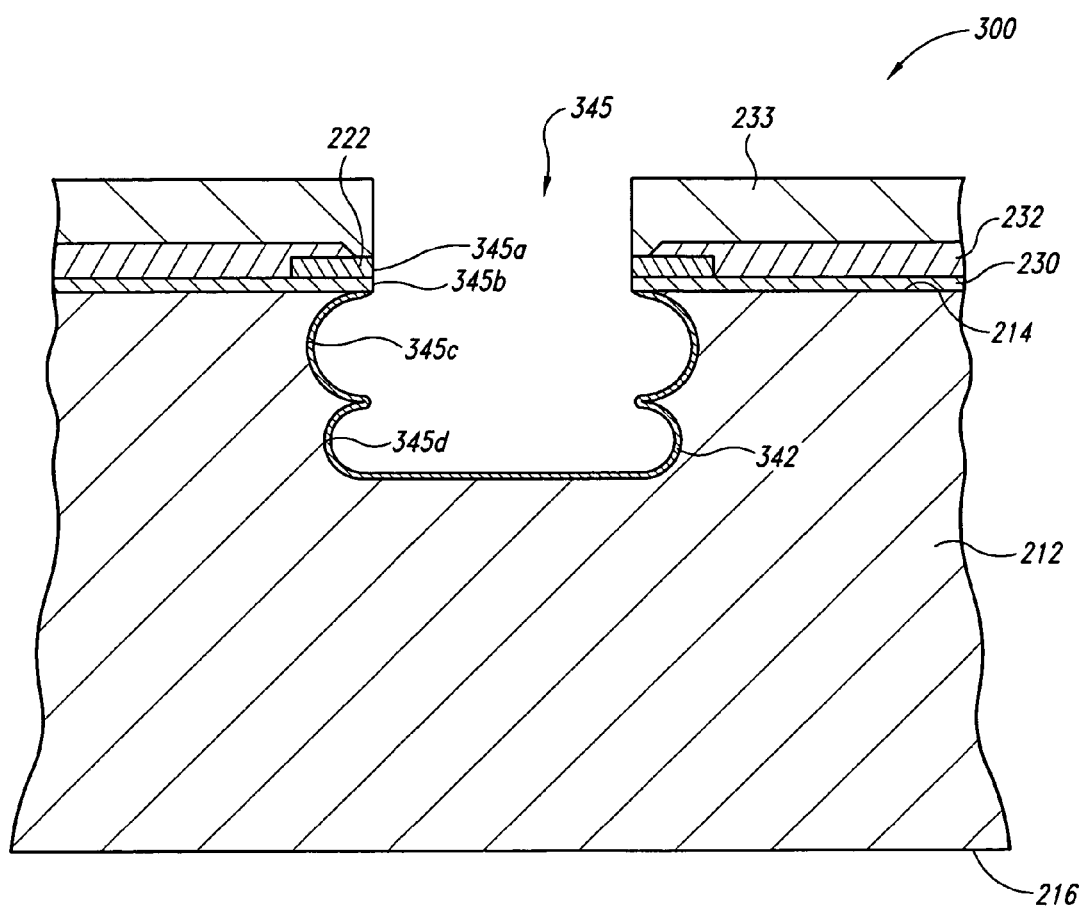
Figure 3G:
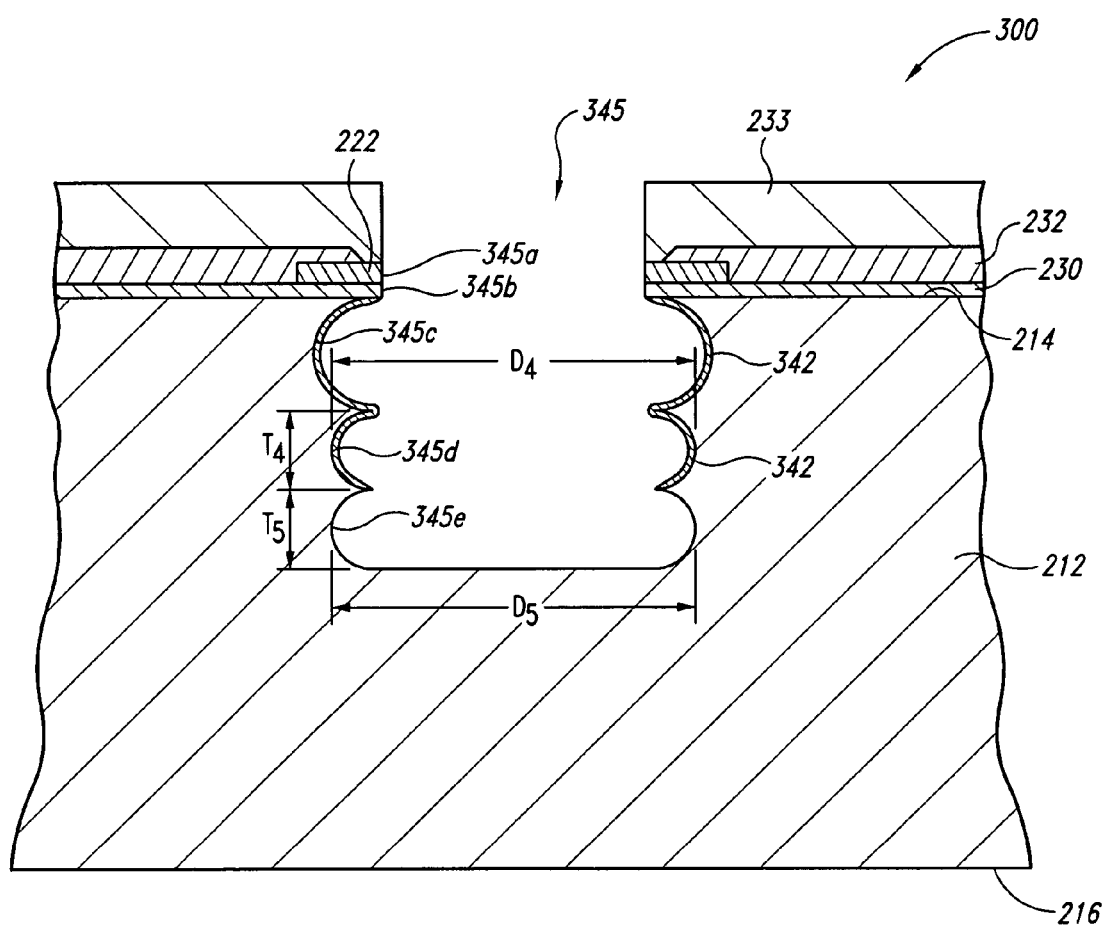

Referring to FIG. 3F, the third dielectric layer 342 is again applied to coat the newly formed fourth hole section 345d and inhibit the section 345d from becoming further widened as the hole 345 is deepened. Referring to FIG. 3G, a fifth hole section 345e has been formed in the substrate 212 below the fourth hole section 345d by a third etching cycle. The fifth hole section 345e has a fifth major lateral dimension $D_5$ generally the same as the fourth major lateral dimension $D_4$ of the fourth hole section 345d, and a fifth depth $T_5$ generally the same as the fourth depth T4. The third etching cycle can be accordingly generally the same as the second etching cycle. After forming the fifth hole section 345e, the process of applying the dielectric layer 342 to the newly formed hole section and then etching an additional hole section in the substrate 212 can be repeated until the hole 345 extends to a desired depth in the substrate 212. After the hole 345 has been formed to the desired depth in the substrate 212, an interconnect can be formed in the hole 345 as described above with reference to FIGS. 2H-2Q.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A method for forming an interconnect in a microfeature workpiece, the microfeature workpiece including a substrate, a terminal, and a dielectric layer between the substrate and the terminal, the method comprising:

forming a hole extending through the terminal and the dielectric layer to at least an intermediate depth in the substrate, the hole having a first lateral dimension in the dielectric layer and a second lateral dimension in the substrate proximate to an interface between the dielectric layer and the substrate, the second lateral dimension being greater than the first lateral dimension, wherein forming a hole extending through the terminal and the dielectric layer to at least an intermediate depth in the substrate occurs in a single etching process; and constructing an electrically conductive interconnect in at least a portion of the hole and in electrical contact with the terminal.

2. The method of claim 1 wherein the dielectric layer is a first dielectric layer, and wherein forming the hole comprises:

exposing the substrate to an etchant for a first time period to form a first section of the hole in the substrate;

forming a second dielectric layer in the first section of the hole after exposing the substrate for the first time period; and exposing the substrate to an etchant for a second time period to form a second section of the hole in the substrate after depositing the second dielectric layer, the second time period being less than the first time period.

3. The method of claim 1 wherein forming the hole comprises:

etching the substrate in a first cycle for a first time period to form a first section of the hole in the substrate; and etching the substrate in a second cycle for a second time period to form a second section of the hole in the substrate, the second time period being less than the first time period.

4. The method of claim 1 wherein forming the hole comprises constructing a first section of the hole through the dielectric layer and a second section of the hole in the substrate in a single, generally continuous process.

5. The method of claim 1 wherein forming the hole comprises etching the dielectric layer and a portion of the substrate in a single etching process.

6. The method of claim 1 wherein forming the hole comprises removing a portion of the dielectric layer and forming an undercut in the substrate adjacent to the dielectric layer in a single, generally continuous process.

7. The method of claim 1 wherein forming the hole comprises:
   removing material from the dielectric layer and the substrate in a first process with first process parameters; and
   removing additional material from the substrate in a second process with second process parameters after the first process, wherein the second process parameters are different than the first process parameters.

8. The method of claim 1 wherein forming the hole comprises:
   removing a portion of the dielectric layer and a first portion of the substrate with an oxide etch; and
   removing a second portion of the substrate with a deep silicon etch.

9. The method of claim 1 wherein forming the hole comprises constructing the hole such that the dielectric layer overhangs a section of the hole in the substrate at the interface between the dielectric layer and the substrate.

10. The method of claim 1 wherein forming the hole comprises constructing a through hole that extends through the workpiece.

11. The method of claim 1 wherein forming the hole comprises constructing a blind hole that does not extend through the workpiece.

12. The method of claim 1 wherein forming the hole comprises laser cutting a section of the hole in the workpiece.

13. A method for manufacturing a microfeature workpiece, the method comprising:
   providing a microfeature workpiece including a substrate, a dielectric layer on the substrate, and a terminal on the dielectric layer;
   forming a hole in the terminal of the microfeature workpiece; and
   removing a portion of the dielectric layer and a portion of the substrate in a single, generally continuous etching process, wherein the portion of the dielectric layer and the portion of the substrate are generally aligned with the hole in the terminal, and wherein the dielectric layer overhangs at least a portion of the hole adjacent to an interface between the dielectric layer and the substrate.

14. The method of claim 13 wherein removing the portion of the dielectric layer and the portion of the substrate comprises etching the portion of the dielectric layer and the portion of the substrate.

15. The method of claim 13 wherein the hole is a first hole in the terminal, and wherein removing the portion of the dielectric layer and the portion of the substrate comprises forming a second hole in the dielectric layer and the substrate aligned with the first hole.

16. The method of claim 13 wherein removing the portion of the dielectric layer and the portion of the substrate comprises forming an undercut in the substrate adjacent to the dielectric layer.

17. The method of claim 13 wherein:
   the hole is a first hole in the terminal;
   removing the portion of the dielectric layer and the portion of the substrate comprises forming a second hole in the dielectric layer and the substrate aligned with the first hole; and
   the method further comprises constructing an electrically conductive interconnect in at least a portion of the first and second holes.

18. The method of claim 13 wherein:
   the hole is a first hole in the terminal;
   removing the portion of the dielectric layer and the portion of the substrate comprises forming a second hole in the dielectric layer and a third hole in the substrate, with the first, second, and thirds holes generally aligned; and
   the second hole has a first lateral dimension and the third hole has a second lateral dimension greater than the first lateral dimension.

19. The method of claim 13 wherein:
   removing the portion of the dielectric layer and the portion of the substrate comprises removing the portion of the dielectric layer and a first portion of the substrate with an oxide etch; and
   the method further comprises removing a second portion of the substrate with a deep silicon etch.

20. The method of claim 13 wherein the hole is a first hole in the terminal, and wherein removing the portion of the dielectric layer and the portion of the substrate comprises forming a second hole in the dielectric layer and the substrate such that the dielectric layer overhangs a section of the second hole in the substrate at an interface between the dielectric layer and the substrate.

21. A method for manufacturing a micro feature workpiece, the microfeature workpiece including a substrate, a dielectric layer on the substrate, and a terminal on the dielectric layer, the method comprising:
   forming a first section of a hole through the terminal and the dielectric layer of the microfeature workpiece; and
   forming a second section of the hole in the substrate such that the dielectric layer overhangs at least a portion of the second section of the hole adjacent to an interface between the dielectric layer and the substrate, wherein forming the first section of the hole comprises constructing a first portion of the first section through the terminal and constructing a second portion of the first section through the dielectric layer, and wherein constructing the second portion of the first section in the dielectric layer and forming the second section of the hole in the substrate occur in a single etching process.

22. The method of claim 21 wherein forming the first section of the hole comprises:
   removing material from the terminal to form a first portion of the first section of the hole in a first process; and
   removing material from the dielectric layer to form a second portion of the first section of the hole in a second process different than the first process.

23. The method of claim 21 wherein the dielectric layer is a first dielectric layer, and wherein forming the second section of the hole comprises:
   exposing the substrate to an etchant for a first time period to form a first portion of the second section of the hole in the substrate;
   forming a second dielectric layer in the first portion of the second section of the hole after exposing the substrate for the first time period; and exposing the substrate to an etchant for a second time period to form a second portion of the second section of the hole in the substrate after depositing the second dielectric layer, the second time period being less than the first time period.

24. The method of claim 21 wherein forming the second section of the hole comprises:

etching the substrate in a first cycle for a first time period to form a first portion of the second section of the hole in the substrate; and etching the substrate in a second cycle for a second time period to form a second portion of the second section of the hole in the substrate, the second time period being less than the first time period.

25. The method of claim 21 wherein:

forming the first section of the hole comprises constructing a first portion of the first section through the terminal and constructing a second portion of the first section through the dielectric layer; and constructing the second portion of the first section in the dielectric layer and forming the second section of the hole in the substrate occur in a single, generally continuous process.

26. The method of claim 21 wherein forming the second section of the hole in the substrate comprises:

removing material from the substrate in a first process with first process parameters; and removing additional material from the substrate in a second process with second process parameters after the first process, wherein the second process parameters are different than the first process parameters.

27. A method for manufacturing a microfeature workpiece, the microfeature workpiece including a substrate, a dielectric layer on the substrate, and a terminal on the dielectric layer, the method comprising forming a passageway through the terminal and the dielectric layer to at least an intermediate depth in the substrate in a single etching process, with an undercut at an interface between the dielectric layer and the substrate.

28. The method of claim 27 wherein forming the passageway comprises constructing a hole having a first lateral dimension in the dielectric layer and a second lateral dimension in the substrate proximate to the interface between the dielectric layer and the substrate, the second lateral dimension being greater than the first lateral dimension.

29. The method of claim 27 wherein forming the passageway comprises laser cutting the microfeature workpiece.

30. The method of claim 27 wherein forming the passageway comprises constructing a first section of a hole through the dielectric layer and a second section of the hole in the substrate in a single, generally continuous process.

31. The method of claim 27 wherein forming the passageway comprises etching the dielectric layer and a portion of the substrate in a single etching process.

32. The method of claim 27 wherein forming the passageway comprises:

etching the substrate in a first cycle for a first time period to form a first section of the passageway in the substrate; and etching the substrate in a second cycle for a second time period to form a second section of the passageway in the substrate, the second time period being less than the first time period.

* * * * *